US006977132B2

(12) United States Patent
Yamasaki et al.

(10) Patent No.: US 6,977,132 B2
(45) Date of Patent: Dec. 20, 2005

(54) PLANOGRAPHIC PRINTING PLATE PRECURSOR

(75) Inventors: Sumiaki Yamasaki, Shizuoka-ken (JP); Koichi Kawamura, Shizuoka-ken (JP); Hisashi Hotta, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/310,813

(22) Filed: Dec. 6, 2002

(65) Prior Publication Data

US 2003/0170566 A1 Sep. 11, 2003

(30) Foreign Application Priority Data

Dec. 7, 2001 (JP) ....................................... 2001-374156

(51) Int. Cl.[7] .................................................. G03F 7/11

(52) U.S. Cl. ................................ 430/270.1; 430/271.1; 430/272.1; 430/273.1; 430/302; 101/453; 101/454; 101/463.1

(58) Field of Search ........................... 430/270.1, 271.1, 430/272.1, 273.1, 275.1, 278.1, 302; 101/453, 454, 463.1

(56) References Cited

U.S. PATENT DOCUMENTS

| | | | | |
|---|---|---|---|---|
| 5,962,188 A | | 10/1999 | DeBoer et al. | |
| 6,014,930 A | | 1/2000 | Burberry et al. | |
| 6,607,866 B1 | * | 8/2003 | Kawamura et al. | 430/270.1 |
| 6,672,210 B2 | * | 1/2004 | Kawamura et al. | 101/457 |
| 2002/0023565 A1 | | 2/2002 | Kawamura et al. | |
| 2002/0134266 A1 | | 9/2002 | Yamasaki et al. | |
| 2003/0118849 A1 | * | 6/2003 | Yamasaki et al. | 428/447 |
| 2003/0143407 A1 | * | 7/2003 | Yamasaki et al. | 428/447 |
| 2003/0170566 A1 | | 9/2003 | Yamasaki et al. | |
| 2003/0186057 A1 | | 10/2003 | Oohashi et al. | |
| 2004/0060465 A1 | | 4/2004 | Yamasaki et al. | |

FOREIGN PATENT DOCUMENTS

| | | | | | |
|---|---|---|---|---|---|
| EP | 0 709 228 A1 | | 5/1996 | |
| EP | 0 903 224 A2 | | 3/1999 | |
| EP | 0 938 972 A1 | | 9/1999 | |
| EP | 0 949 088 A1 | | 10/1999 | |
| EP | 1 057 622 A2 | | 12/2000 | |
| EP | 1 088 679 A2 | * | 4/2001 | B41N/3/03 |
| EP | 1 172 696 A1 | | 1/2002 | |
| EP | 1 211 096 A1 | | 6/2002 | |
| EP | 1 226 976 A1 | | 7/2002 | |
| JP | 59-101651 A | | 6/1984 | |
| JP | 7-1853 A | | 1/1995 | |
| JP | 8-507727 A | | 8/1996 | |
| JP | 8-272087 A | | 10/1996 | |
| JP | 8-292558 A | | 11/1996 | |
| JP | 2001-166491 | * | 6/2001 | |
| JP | 2001-213062 A | | 8/2001 | |
| JP | 2001-315452 A | | 11/2001 | |
| WO | WO 94/23954 A1 | | 10/1994 | |
| WO | WO 96/29375 A1 | | 9/1996 | |

OTHER PUBLICATIONS

"Cleaning Buildings Using Rain as a Shower", The Chemical Daily, Jan. 30, 1995.

* cited by examiner

*Primary Examiner*—Barbara L. Gilliam
(74) *Attorney, Agent, or Firm*—Sughrue Mion, PLLC

(57) ABSTRACT

The invention provides a planographic printing plate precursor, utilizing a support member having a hydrophilic surface excellent in hydrophilicity and durability, providing effects of improving scumming in the printing operation and capable of forming large numbers of prints of high image quality even under severe printing conditions. The precursor comprises a support including an aluminum substrate and a hydrophilic layer disposed thereon, the hydrophilic layer formed by chemically bonding a hydrophilic polymer, which includes a reactive group able to chemically bond to a surface of the aluminum substrate directly or via a structural component comprising a crosslinked structure; and a positive working recording layer disposed on the support and including a light-absorbing and heat-generating material, and a polymer compound, which is insoluble in water and soluble in alkali, wherein solubility of the recording layer in an alkaline aqueous solution increases upon exposure to light.

22 Claims, No Drawings

PLANOGRAPHIC PRINTING PLATE PRECURSOR

BACKGROUND OF THE INVENTION

1. Field of the Invention

The present invention relates to a positive working planographic printing plate precursor, and more particularly to a positive working planographic printing plate precursor for so-called direct platemaking, for making a printing plate directly from a digital signal of, for example, a computer.

2. Description of the Related Art

Planographic printing is a printing method utilizing a printing plate including an oleophilic area which accepts ink and an ink repellent area (a hydrophilic area) which does not accept ink but accepts a wetting water. Currently a photosensitive or presensitized planographic printing plate precursor (PS plate) is widely used in planographic printing.

The PS plate, which comprises a photosensitive layer disposed on a support member, such as an aluminum plate, has been commercialized and widely employed. The photosensitive layer of a non-image area of the PS plate is removed by an imagewise exposure and a development, and the PS plate is used in the printing, utilizing the hydrophilicity of the surface of the support member and the oleophilicity of the photosensitive layer in the image area. In such a printing plate, a high hydrophilic property is required on the surface of the support member, in order to prevent scumming in the non-image area.

Previously, as the hydrophilic support member or the hydrophilic layer to be employed in the planographic printing plate, an anodized aluminum plate, or a silicate processing of such an anodized aluminum plate for further increasing the hydrophilic property, has generally been employed. Moreover, active research of the hydrophilic support member or the hydrophilic layer utilizing such aluminum plate is being performed. For example, a support member which is undercoated with polyvinylsulfonic acid (for example cf. following patent reference 1) and a technique utilizing a polymer having a sulfonic acid group in the undercoat layer for the photosensitive layer (for example cf. following patent reference 2) have been proposed. In addition a technique utilizing polyvinylbenzoic acid as the undercoat material has also been proposed.

Regarding the hydrophilic layer when a flexible support member such as one of PET (polyethylene terephthalate) or cellulose acetate is used instead of a metallic support member such as aluminum, various technologies have been proposed such as a swelling hydrophilic layer composed of a hydrophilic polymer and a hydrophobic polymer (for example cf. following patent reference 3), a PET support member having a microporous surface of hydrophilic crosslinked silicate (for example cf. following patent reference 4) and a hydrophilic layer including a hydrophilic polymer and hardened with hydrolyzed tetraalkylorthosilicate (for example cf. following patent reference 5 or 6).

Such hydrophilic layers provide planographic printing plates showing an improved hydrophilicity in comparison with the prior art and capable of providing prints free of scumming at the start of a printing operation, but have such drawbacks as being peeled off during the course of the printing operation or losing the hydrophilicity over time. For these reasons, a planographic printing plate precursor, in which the hydrophilic layer does no peel from the support member and the hydrophilicity of the surface is not lost even under more severe printing conditions and capable of providing a large number of prints without scumming, is desired. Also from a practical standpoint, a further improvement in the hydrophilic property is currently required.

Patent References

1: JP-A No. 7-1853
2: JP-A No. 59-101651
3: JP-A No. 8-292558
4: European Patent No. 709,228
5: JP-A No. 8-272087
6: JP-A No. 8-507727

SUMMARY OF THE INVENTION

The present invention has been made in view of the above circumstances and provides a planographic printing plate precursor utilizing a support member provided with a hydrophilic surface which shows a high hydrophilicity and is excellent in durability thereof, thereby being improved in the print scumming and capable of providing a large number of high-quality prints even under severe printing conditions.

The present inventors have found that the above can be realized by bonding a hydrophilic polymer, having a reactive group capable of chemical bonding with the surface of an aluminum substrate, to such an aluminum substrate, and have attained the present invention.

More specifically, the planographic printing plate precursor of the invention is comprising:

a support including an aluminum substrate and a hydrophilic layer disposed thereon, the hydrophilic layer formed by chemically bonding a hydrophilic polymer, which includes a reactive group able to chemically bond to a surface of said aluminum substrate either directly or via a structural component comprising a crosslinked structure; and a positive working recording layer disposed on the support and including a material for absorbing light and generating heat, and a polymer compound, which is insoluble in water and soluble in alkali;

wherein a solubility of the positive working recording layer in an alkaline aqueous solution is increased by exposure to light.

The hydrophilic polymer is preferably provided, at an end of the polymer, with a reactive group capable of chemical bonding either directly with the surface of the aluminum substrate or via a structural component having a crosslinked structure.

Among these, a preferred specific example of the hydrophilic surface chemically bonded to the surface of the aluminum substrate via the structural component having the crosslinked structure is a configuration in which the hydrophilic surface has a crosslinked structure formed by hydrolysis or condensation polymerization of an alkoxide compound including an element selected from Si, Ti, Zr or Al.

More specifically, the hydrophilic polymer to be employed in the invention can be that represented by following general formula (1) or (2):

General Formula (1)

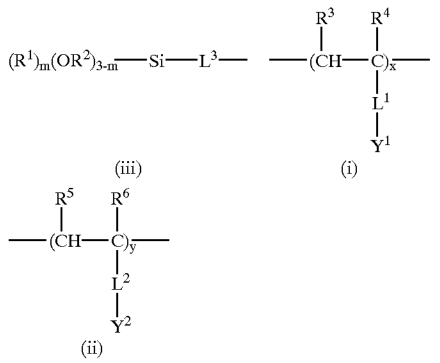

The general formula (1) represents a polymer compound having a silane coupling group represented by a structural unit (iii) at an end of a polymer unit represented by structural units (i) and (ii), wherein $R^1$, $R^2$, $R^3$, $R^4$, $R^5$ and $R^6$ independently represent a hydrogen atom or a hydrocarbon group of 1 to 8 carbon atoms; m stands for 0, 1 or 2; n represents an integer from 1 to 8; x and y each represents a composition ratio in which x+y=100 and x:y is within a range from 100:0 to 1:99. Also $L^1$, $L^2$ and $L^3$ independently represent a single bond or an organic connecting group; $Y^1$ and $Y^2$ independently represent —$N(R^7)$ $(R^8)$, —OH, —$NHCOR^7$, —$COR^7$, —$CO_2M$ or —$SO_3M$ in which $R^7$ and $R^8$ independently represent a hydrogen atom or an alkyl group of 1 to 8 carbon atoms and M represents a hydrogen atom, an alkali metal, an alkali earth metal or an onium.

General Formula (2)

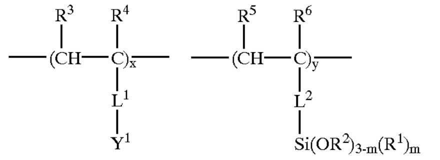

wherein $R^1$, $R^2$, $R^3$, $R^4$, $R^5$ and $R^6$ independently represent a hydrogen atom or a hydrocarbon group of 1 to 8 carbon atoms; m stands for 0, 1 or 2; x and y each represents a composition ratio in which x+y=100 and x:y is within a range from 99:1 to 50:50. Also $L^1$ and $L^2$ independently represent a single bond or an organic connecting group; $Y^1$ represents —$N(R^7)$ $(R^8)$, —OH, —$NHCOR^7$, —$COR^7$, —$CO_2M$ or —$SO_3M$ in which $R^7$ and $R^8$ independently represent a hydrogen atom or an alkyl group of 1 to 8 carbon atoms and M represents a hydrogen atom, an alkali metal, an alkali earth metal or an onium.

More preferably, a hydrophilic coating liquid including a crosslinking component represented by a following general formula (3) together with the hydrophilic polymer is prepared, and coated and dried on the surface of the aluminum substrate whereby a hydrophilic surface having a strong crosslinked structure can be easily formed:

$(R^9)_m$—X—$(OR^{10})_{4-m}$ General Formula (3)

wherein $R^9$ and $R^{10}$ independently represent an alkyl group; X represents Si, Al, Ti or Zr; and m stands for an integer from 0 to 2.

The mechanism of the invention is not yet clarified but is presumed as follows. In the support member employed in the invention, since the polymer having a hydrophilic group is further provided in the molecule thereof with a reactive group capable of chemical bonding either directly to the surface of the aluminum substrate or via the structural component having the crosslinked structure, such hydrophilic polymer is firmly bonded by a coupling reaction with a functional group such as —$Al^{3+}$ or —OH present on the surface of the aluminum substrate. On the other hand, the hydrophilic group is not involved in such bonding reaction with the aluminum substrate but remains in a relatively free state, so that a firm bonding and a high hydrophilicity can be realized at the same time. Besides, in a preferred embodiment, since the hydrophilic group is adhered to the aluminum substrate via a crosslinked structure formed by hydrolysis or condensation polymerization of an alkoxide compound having a graft structure and including an element selected from Si, Ti, Zr and Al, the hydrophilic surface is assumed to constitute a film of a high hydrophilicity and a high strength, in which the hydrophilic groups introduced as graft chains are concentrated on the surface in a free state and an organic-inorganic composite film of a highly dense crosslinked structure is formed by the hydrolysis or condensation polymerization of the alkoxide compound.

The planographic printing plate precursor of the invention of a structure having a positive working recording layer, of which solubility in an alkaline aqueous solution increases upon exposure to light, on a support member having aforementioned hydrophilic surface, is therefore capable of exhibiting an excellent hydrophilic property by the hydrophilic surface in an exposed area when the positive working recording layer in such exposed area is promptly removed by an alkaline developing solution after the exposure to light. It is therefore presumably made possible to increase the feeding and discharging rate of a fountain solution supplied at the printing operation, to effectively suppress the scumming in a non-image area by such excellent hydrophilic property and to retain the hydrophilic nature by the strong crosslinked structure of the hydrophilic surface, thereby providing prints of a satisfactory image quality without scumming in the non-image area even after the printing of a large number of prints and thus realizing a high print run length.

DESCRIPTION OF THE PREFERRED EMBODIMENTS

In the following there will be given a detailed description on the planographic printing plate precursor of the present invention.

The planographic printing plate precursor of the invention comprises, on a support member having, on an aluminum substrate (hereinafter suitably abbreviated as "substrate"), a hydrophilic surface formed by chemical bonding of a hydrophilic polymer having at least one of a reactive group capable of chemical bonding directly with the surface of the substrate and a reactive group capable of chemical bonding with the surface of the substrate via a structural component having a crosslinked structure (such polymer being hereinafter suitably called "specified hydrophilic polymer"), a positive working recording layer which includes a substance capable of generating heat upon absorption of light and a polymer compound insoluble in water but soluble in an alkali and of which solubility in an alkaline aqueous solution increases upon exposure to light.

In the following there will be explained the support member and the positive working recording layer in the planographic printing plate precursor of the invention.

<Support Member>

[Specified Hydrophilic Polymer]

At first there will be given an explanation on the specified hydrophilic polymer to be employed in the support member of the invention.

The specified hydrophilic polymer to be employed may be of any type that has a reactive group capable of chemical bonding either directly to the surface of the substrate or via a structural component having a crosslinked structure either at an end of the hydrophilic polymer or on a side chain and also has a hydrophilic functional group.

Such specified hydrophilic polymer preferably has a crosslinkable group, such as an alkoxy group, as the reactive group, and such crosslinkable group may be bonded by a coupling reaction with a functional group such as —$Al^{+3}$ or —OH present on the surface of the substrate, or bonded to the substrate via a crosslinked structure formed by hydrolysis or condensation polymerization of such crosslinkable group, by preparing a hydrophilic coating liquid containing the specified hydrophilic polymer and coating and drying the liquid on the surface of the substrate. The crosslinked structure prepared by the latter method can easily form a firm hydrophilic surface excellent in durability and is therefore a preferred embodiment in the invention. Such crosslinked structure will be called "sol-gel crosslinked structure" in the invention.

Further, the crosslinkable group is preferably an alkoxide compound including an element selected from Si, Ti, Zr and Al, preferably a Si alkoxide in consideration of the reactivity and availability, and more specifically a compound usable as a silane coupling agent can be advantageously employed.

In the following, a detailed explanation will be given on preferred embodiments of the hydrophilic surface in the support member of the invention.

The specified hydrophilic polymer to be employed in the invention is not particularly limited as long as it includes at least a hydrophilic group and aforementioned specified reactive group within the molecule, but a preferred embodiment includes a structure represented by the following general formula (1) or (2).

(Specified Hydrophilic Polymer Represented by the General Formula (1))

The specified hydrophilic polymer represented by the following general formula (1) (hereinafter occasionally called "specified hydrophilic polymer (1)") has a silane coupling group at an end:

General Formula (1)

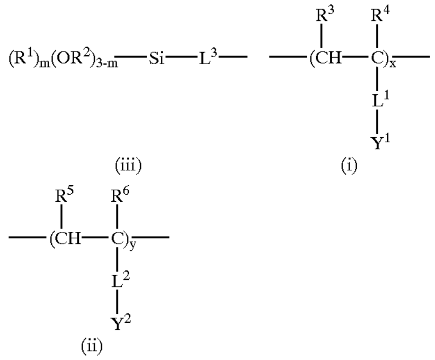

(iii) (i) (ii)

The specified hydrophilic polymer represented by the general formula (1) is required to have a silane coupling group represented by a structural unit (iii) in at least one of both ends of a polymer unit represented by structural units (i) and (ii), but may have such functional group at the other end and may also have a hydrogen atom or a functional group showing a polymerization starting ability.

In the general formula (1), m represents 0, 1 or 2; $R^1$, $R^2$, $R^3$, $R^4$, $R^5$ and $R^6$ each independently represents a hydrogen atom or a hydrocarbon group with 8 carbon atoms or less. The hydrocarbon group can be an alkyl group or an aryl group, and is preferably a straight-chain, branched or cyclic alkyl group with 8 carbon atoms or less. Specific examples include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl and cyclopentyl groups.

Each of $R^1$ to $R^6$ is preferably a hydrogen atom, methyl group or ethyl group in consideration of the effect and the availability.

Such hydrocarbon group may further includes a substituent.

In case the alkyl group has a substituent, the substituted alkyl group is formed by a bonding of a substituent and an alkylene group, and, as the substituent, there can be employed a non-metallic atomic group other than hydrogen atom. Preferred examples include a halogen atom (—F, —Br, —Cl, —I), hydroxyl, alkoxy, aryloxy, mercapto, alkylthio, arylthio, alkyldithio, aryldithio, amino, N-alkylamino, N,N-diarylamino, N-alkyl-N-arylamino, acyloxy, carbamoyloxy, N-alkylcarbamoyloxy, N-arylcarbamoyloxy, N,N-dialkylcarbamoyl-oxy, N,N-diarylcarbamoyloxy, N-alkyl-N-arylcarbamoyloxy, alkylsulfoxy, arylsulfoxy, acylthio, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-NN-aryloxycarbonylamino, formyl, acyl, carboxyl, alkyoxycarbonyl, ayloxycarbonyl, carbamoyl, N-alkylcarbamoyl, N,N-dialkylcarbomoyl, N-arylcarbamoyl, N,N-diarylcarbamoyl, N-alkyl-N-arylcarbamoyl, alkylsulfinyl, arylsulfinyl, alkylsulfonyl, arylsulfonyl, sulfo (—$SO_3H$) and a conjugate base thereof (hereinafter called sulfonato), alkoxysulfonyl, aryloxysulfonyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl, sulfamoyl, N-alkylsulfamoyl, N,N-dialkylsulfamoyl, N-arylsulfamoyl, N,N-diarylsulfamoyl, N-alkyl-N-arylsulfamoyl, phosphono (—$PO_3H_2$) and conjugate base thereof (hereinafter called phosphonato), dialkylphosphono (—$PO_3$ $(alkyl)_2$), diarylphosphono (—$PO_3$ $(aryl)_2)_1$ alkylarylphosphono (—$PO_3$ (alkyl) (aryl)), monoalkylphosphono (—$PO_3H$(alkyl)) and conjugate base thereof (hereinafter called alkylphosphonato), monoarylphosphono (—$PO_3$(aryl)) and conjugate base thereof (hereinafter called arylphosphonato), phosphonooxy (—$OPO_3H_2$) and conjugate base thereof (hereinafter called phosphonatooxy), dialkylphosphonooxy (—$OPO_3$ (alkyl) 2) 1 diarylphosphonooxy (—$OPO_3(aryl)_2$), alkylarylphosphonooxy (—OPO(alkyl) (aryl)), monoalkylphosphonooxy (—$OPO_3H$(alkyl)) and conjugate base thereof (hereinafter called alkylphosphonatooxy), monoaryl-phosphonooxy (—$OPO_3H$ (aryl)) and conjugate base thereof (hereinafter called arylphophonatooxy), morpholino, cyano, nitro, aryl, alkenyl and alkynyl groups.

Among such substituents, specific examples of the alkyl group include aforementioned alkyl group, and specific examples of the aryl group include phenyl, biphenyl, naphthyl, tolyl-2, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, cyanophenyl, sulfophenyl, sulfonatophenyl, phosphonophenyl, and phosphonatophenyl groups. Also examples of the alkenyl group include vinyl, 1-propenyl, 1-butenyl, cinnamyl, and 2-chloro-1-ethenyl groups. Examples of the alkynyl group include ethynyl, 1-propynyl, 1-butynyl and trimethylsilylethynyl groups. In the acyl group (G1CO—), G1 can be a hydrogen atom, an alkyl group or an aryl group mentioned above.

Among these substituents, preferred examples include a halogen atom (—F, —Br, —Cl, —I), alkoxy, aryloxy, alkylthio, arylthio, N-alkylamino, N,N-dialkylamino, acyloxy, N-alkylcarbamoyloxy, N-arylcarbamoyloxy, acylamino, formyl, acyl, carboxyl, alkoxycarbonyl, aryloxycarbonyl, carbamoyl, N-alkylcarbamoyl, N,N-dialkylcarbamoyl, N-arylcarbamoyl, N-alkyl-N-arylcarbamoyl, sulfo, sulfonato, sulfamoyl, N-alkylsulfamoyl, N,N-dialkylsulfamoyl, N-arylsulfamoyl, N-alkyl-N-arylsulfamoyl, phosphono, phosphonato, dialkylphosphono, diarylphosphono, monoalkylphosphono, alkylphosphonato, monoarylphosphono, arylphosphonato, phosphonooxy, phosphonatooxy, aryl and alkenyl groups On the other hand, the alkylene group in the substituted alkyl group can be a divalent organic residue, formed by eliminating any of the hydrogen atoms in aforementioned alkyl groups of 1 to 20 carbon atoms, and is preferably a straight-chain alkylene group with 1 to 12 carbon atoms, a branched alkylene group with 3 to 12 carbon atoms or a cyclic alkylene group with 5 to 10 carbon atoms. Preferred examples of the substituted alkyl group obtained by combining aforementioned substituting group and alkylene group include chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxyethyl, 2-oxypropyl, carboxypropyl, methoxycarbonylethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl, phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonooxypropyl, phosphonatooxybutyl, benzyl, phenetyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups.

In the general formula (1), $L^1$ and $L^2$ each independently represents a single bond or an organic connecting group. In case each of $L^1$ and $L^2$ represents an organic connecting group, each of $L^1$ and $L^2$ represents a polyvalent connecting group formed by non-metallic atoms, more specifically by 1 to 60 carbon atoms, 0 to 10 nitrogen atoms, 0 to 50 oxygen atoms, 1 to 100 hydrogen atoms and 0 to 20 sulfur atoms. More specifically, the connecting group can be formed by any of following structural units or a combination thereof.

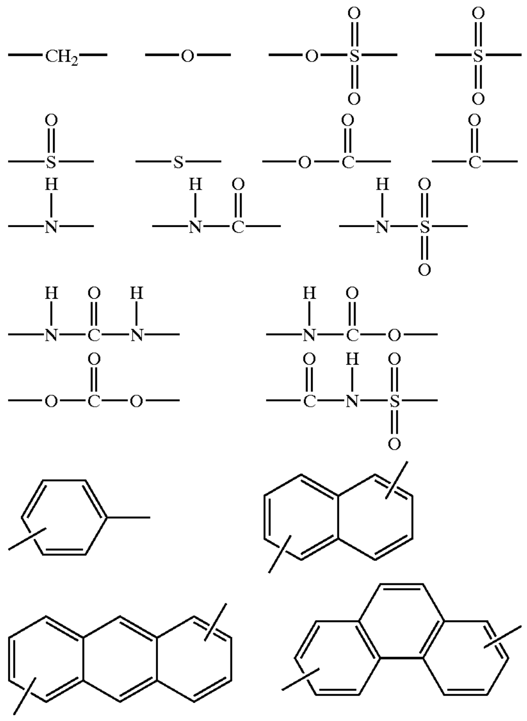

Also $L^3$ represents a single bond or an organic connecting group. In case $L^3$ represents an organic connecting group, it represents a polyvalent connecting group formed by non-metallic atoms, and, more specifically, can be similar to $L^1$ and $L^2$ mentioned above. Among these, particularly preferred structure is $—(CH_2)_n—S—$, wherein n indicates an integer from 1 to 8.

Also $Y^1$ and $Y^2$ each independently represents $—N(R^7)(R^8)$, —OH, $—NHCOR^7$, $—COR^7$, $—CO_2M$ or $—SO_3M$, wherein $R^7$ and $R^8$ each independently represents a hydrogen atom or an alkyl group with 1 to 8 carbon atoms, and M represents a hydrogen atom, an alkali metal, an alkali earth metal or an onium. Also in case $Y^1$ and $Y^2$ are $—CON(R^7)(R^8)$, $R^7$ and $R^8$ may be mutually bonded to form a ring, and the formed ring may be a hetero ring including a hetero atoms such as an oxygen atom, a sulfur atom, or a nitrogen atom. $R^7$ and $R^8$ may further include a substituent, and the substituent that can be introduced may be similar to those usable in case $R^1$ to $R^6$ are alkyl groups.

Preferred examples of $R^7$ and $R^8$ include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl and cyclopentyl groups.

Examples of M include a hydrogen atom; an alkali metal such as lithium, sodium or potassium; an alkali earth metal such as calcium or barium; and an onium such as ammonium, iodonium or sulfonium.

Also preferred examples of $Y^1$ and $Y^2$ include —$NHCOCH_3$, —$CONH_2$, —COOH, —$SO_3NMe^{4+}$ and morpholino group.

In the general formula (1), x and y indicate composition ratios where x+y=100, and x:y indicates a range from 100:0 to 1:99, preferably 100:0 to 5:95.

The specified hydrophilic polymer (1) preferably has a molecular weight within a range of 1,000 to 100,000, more preferably 1,000 to 50,000 and most preferably 1,000 to 30,000.

With respect to the specified hydrophilic polymer (1) advantageously employable in the invention, specific examples (1-1) to (1-23) will be shown in the following, but the invention is not limited to such examples.

(1-1)

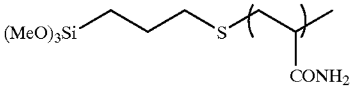

(1-2)

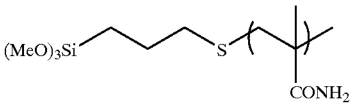

(1-3)

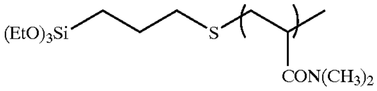

(1-4)

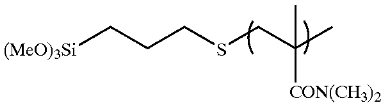

(1-5)

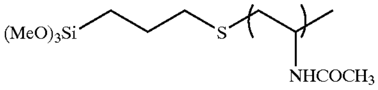

(1-6)

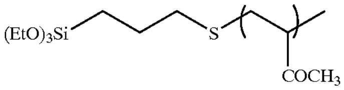

(1-7)

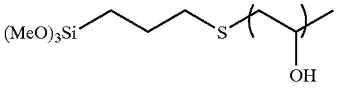

(1-8)

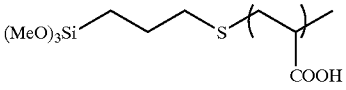

(1-9)

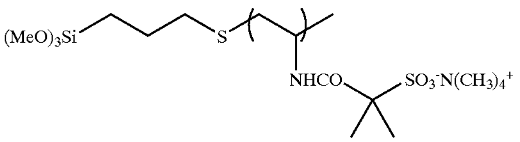

(1-10)

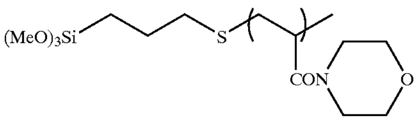

-continued (1-11)

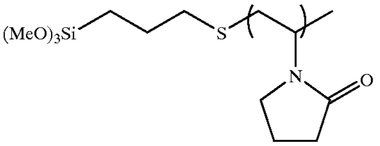

(1-12)

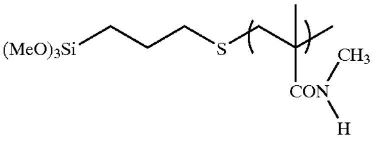

(1-13)

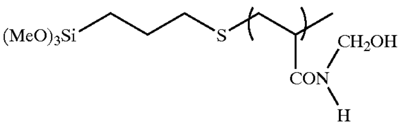

(1-14)

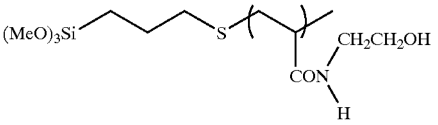

(1-15)

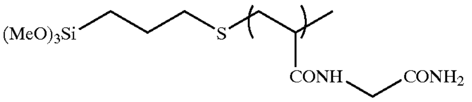

(1-16)

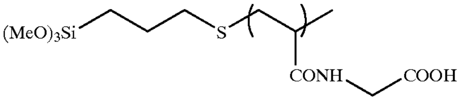

(1-17)

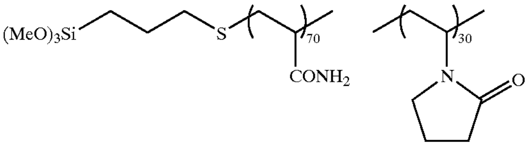

(1-18)

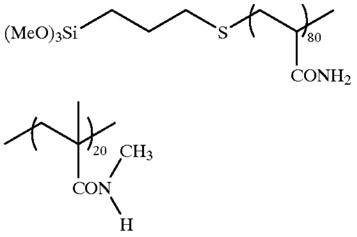

(1-19)

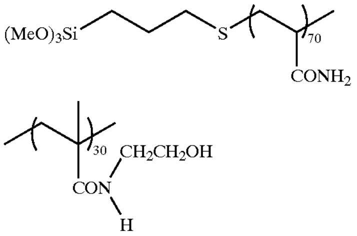

(1-20)

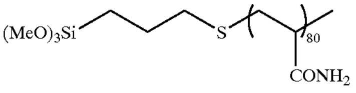

-continued

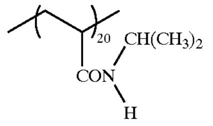

(1-21)

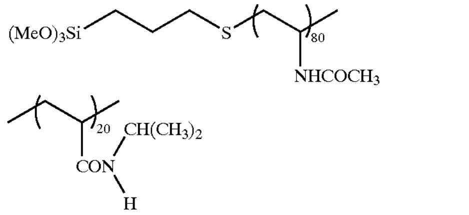

(1-22)

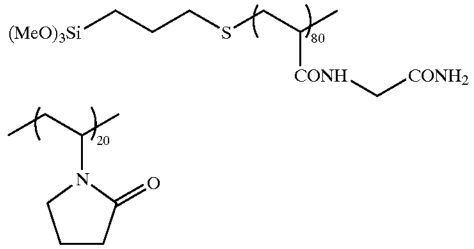

(1-23)

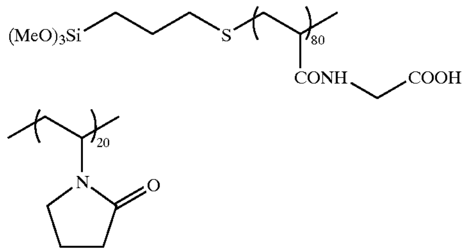

(Method of Synthesizing Specified Hydrophilic Polymer (1))

The specified hydrophilic polymer (1) of the invention can be synthesized by radical polymerization utilizing a monomer capable of radical polymerization represented by following structural units (i) and (ii) and a silane coupling agent represented by a following structual unit (iii) and having a chain shifting ability in the radical polymerization. Since the silane coupling agent has a chain shifting ability, there can be synthesized, in the radical polymerization, a polymer in which a silane coupling group is introduced at an end of the main chain of the polymer.

The mode of reaction is not particularly limited, but there can be executed a bulk reaction, a solution reaction or a suspension reaction in the presence of a radical polymerization initiator or under the irradiation with a high pressure mercury lamp.

It is preferred to execute the polymerization utilizing divided additions or successive additions of an unsaturated compound, in order to control the amount of introduction of the structural unit represented by (iii) and to effectively suppress a homopolymerization thereof with the structural unit (i) or (ii) in the polymerization reaction.

The reaction ratio of the structural units (i), (ii) with respect to the structural unit (iii) is not particularly limited, but an amount of the structural units (i), (ii) within a range of 0.5 to 50 moles with respect to 1 mole of the structural unit (iii) is preferred in view of suppressing a sub reaction or improving the yield of a hydrolyzable silane compound, more preferably 1 to 45 moles and most preferably 5 to 40 moles.

General Formula (1)

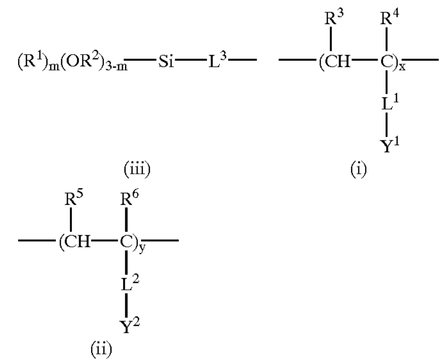

In the above-mentioned structural units (i), (ii) and (iii), $R^1$ to $R^6$, $L^1$ to $L^3$, $Y^1$, $Y^2$ and m have same meanings as in the foregoing general formula (1). Also these compounds are commercially available and can be easily synthesized.

For synthesizing the specified hydrophilic polymer (1), there can be employed any radical polymerization method already known in the art. More specifically, the general radical polymerization methods are described, for example, in *Shin Kobunshi Jikkengaku* 3, Synthesis and reaction of polymer 1 (edited by Polymer Society, Kyoritsu Press), *Shin Jikken Kagaku Koza* 19, Polymer chemistry (I) (edited by Chemical Society of Japan, Maruzen), *Busshitsu Kogaku Koza*, and Polymer synthesis chemistry (Tokyo Electric University Press) and such methods may be applied.

Also, the specified hydrophilic polymer (1) can be a copolymer with another monomer to be explained later. The employable another monomer can be a known monomer such as an acrylic acid ester, a methacrylic ester, an acrylamide, a methacrylamide, a vinyl ester, a styrene, acrylic acid, methacrylic acid, acrylonitrile, maleic anhydride or maleimide. The copolymerization of such monomers allows to improve various physical properties such as film forming property, film strength, hydrophilicity, hydrophobicity, solubility, reactivity and stability.

Specific examples of acrylic acid ester include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 2-hydropentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenetyl acrylate, dihyroxyphenetyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

Specific examples of methacrylic acid ester include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 2-hydropentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenetyl methacrylate, dihyroxyphenetyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

Specific examples of acrylamide include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl) acrylamide, N-(phenylsulfonyl)acrylamide, N-(tolylsulfonyl)acrylamide, N,N-dimethylacrylamide, N-methyl-N-phenylacrylamide and N-hydroxyethyl-N-methylacrylamide.

Specific examples of methacrylamide include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl) methacrylamide, N-(sulfamoylphenyl)methacrylamide, N-(phenylsulfonyl)methacrylamide, N-(tolylsulfonyl) methacrylate, N,N-dimethylmethacrylamide, N-methyl-N-phenylmethacrylamide and N-hydroxyethyl-N-methylmethacrylamide.

Specific examples of vinyl ester include vinyl acetate, vinyl butyrate and vinyl benzoate.

Specific examples of styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, promostyrene, iodostyrene, fluorostyrene and carboxystyrene.

The proportion of such other monomers to be used in the synthesis of the copolymer has to be sufficiently large for improving various physical properties, but an excessively large proportion may result in an insufficient function as the support member. Therefore, the total proportion of other monomers in the specified hydrophilic polymer (1) is preferably 80 wt. % or less, more preferably 50 wt. % or less.

(Specified Hydrophilic Polymer Represented by General Formula (2))

The specified hydrophilic polymer represented by the following general formula (2) (hereinafter occasionally called "specified hydrophilic polymer (2)") has a silane coupling group in a side chain:

General Formula (2)

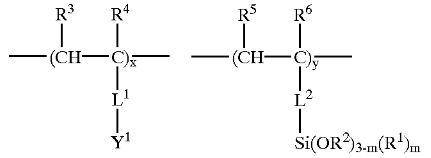

In the general formula (2), m, $R^1$–$R^6$, $L^1$, $L^2$ and $Y^1$ have same meanings as in the general formula (1), and preferred examples are also same.

Also x and y indicate composition ratios where x+y=100, and x:y indicates a range from 99:1 to 50:50, preferably 99:1 to 60:40 and more preferably 98:2 to 70:30.

The specified hydrophilic polymer (2) preferably has a molecular weight within a range of 1,000 to 100,000, more preferably 1,000 to 50,000 and most preferably 1,000 to 30,000.

With respect to the specified hydrophilic polymer (2) advantageously employable in the invention, specific examples (2-1) to (2-7) will be shown in the following, but the invention is not limited to such examples.

(2-1)

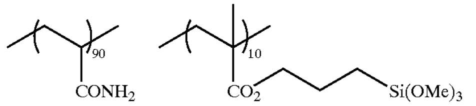

(2-2)

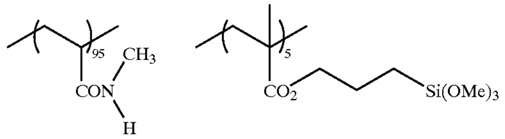

(2-3)

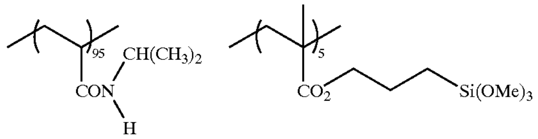

(2-4)

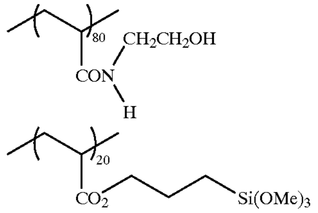

(2-5)

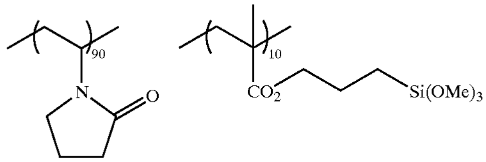

(2-6)

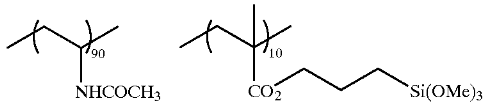

(2-7)

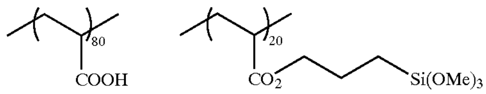

(Method of Synthesizing Specified Hydrophilic Polymer (2))

For synthesizing the specified hydrophilic polymer (2), there can be employed any radical polymerization method already known in the art. More specifically, the general radical polymerization methods are described, for example, in *Shin Kobunshi Jikkengaku* 3, Synthesis and reaction of polymer 1 (edited by Polymer Society, Kyoritsu Press), *Shin Jikken Kagaku Koza* 19, Polymer chemistry (I) (edited by Chemical Society of Japan, Maruzen), *Busshitsu Kogaku Koza*, and Polymer synthesis chemistry (Tokyo Electric University Press) and such methods may be applied.

Also, the specified hydrophilic polymer (2) can be a copolymer with another monomer, which can be similar to that explained in the specified hydrophilic polymer (1).

[Crosslinking Component Represented by General Formula (3)]

The hydrophilic surface of the invention may be formed by chemical bonding of a crosslinking group in the specified hydrophilic polymer directly with a functional group such as $—Al^{3+}$ or —OH on the surface of the aluminum substrate, or by forming a crosslinked structure (sol-gel crosslinked structure) through hydrolysis or condensation polymerization of the crosslinking group by preparing a hydrophilic coating liquid including the specified hydrophilic polymer and coating and drying such coating liquid on the surface of the substrate.

In forming the sol-gel crosslinked structure, it is preferred to mix the specified hydrophilic polymer and a crosslinking component represented by a following general formula (3) and coating and drying such mixture on the surface of the substrate. The crosslinking component represented by the following general formula (3) is a compound having a polymerizable functional group in the structure thereof and capable of serving as a crosslinking agent, and forms a strong film having a crosslinked structure by condensation polymerization with the specified hydrophilic polymer.

$$(R^9)_m—X—(OR^{10})_{4-m} \quad \text{General Formula (3)}$$

wherein $R^9$ represents a hydrogen atom, an alkyl group or an aryl group, $R^{10}$ represents an alkyl group or an aryl group, X represents Si, Al, Ti or Zr, and m represents an integer from 0 to 2.

In case $R^9$ or $R^{10}$ represents an alkyl group, the number of carbon atoms thereof is preferably 1 to 4. The alkyl group or aryl group may have a substituent, and examples of the substituent that can be introduced include a halogen atom, an amino group and a mercapto group.

This compound is of a low molecular weight, which preferably does not exceed 1,000.

In the following there will be given specific examples of the crosslinking component represented by the general formula (3), but the invention is not limited to such examples.

In case X is Si, namely in case the hydrolysable compound contains silicon, examples include trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane and diphenyldiethoxysilane.

Among these, particularly preferred are tetramethoxysilane, tetraethoxysilane, methyltrimethoxysilane, ethyltrimethoxysilane, methyltriethoxysilane, ethyltriethoxysilane, dimethyldiethoxysilane, phenyltrimethoxysilane, phenyltriethoxysilane, diphenyldimethoxysilane and diphenyldiethoxysilane.

In case X is Al, namely in case the hydrolysable compound contains aluminum, examples include trimethoxy aluminate, triethoxy aluminate, tripropoxy aluminate and tetraethoxy aluminate.

In case X is Ti, namely in case the hydrolysable compound contains titanium, examples include trimethoxy titanate, tetramethoxy titanate, triethoxy titanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, and phenyltriethoxy titanate.

In case X is Zr, namely in case the hydrolysable compound contains zirconium, examples include zirconates corresponding to the titanium-containing compounds mentioned above.

[Formation of Hydrophilic Surface]

(Preparation of Hydrophilic Coating Liquid)

In the preparation of the hydrophilic coating liquid composition including the specified hydrophilic polymer, the content of the specified hydrophilic polymer, calculated as solid content, is preferably at least equal to 10 wt. % but less than 50 wt. %. A content equal to or higher than 50 wt. % tends to lower the film strength, while a content less than 10 wt. % deteriorates the film properties, possibly causing crack formation in the film, thus both being undesirable.

Also in case of adding the crosslinking component, as a preferred embodiment, in the preparation of the hydrophilic coating liquid composition, the content of the crosslinking component is preferably 5 mol % or higher, more preferably 10 mol % or higher with respect to the silane coupling groups in the specified hydrophilic polymer. The content of the crosslinking component is not particularly limited at the upper side as long as sufficient crosslinking can be realized with the hydrophilic polymer, but the addition of a large excess amount may result in certain drawbacks such as stickiness of the prepared hydrophilic surface by the crosslinking component not involved in the crosslinking.

The hydrophilic coating liquid of the invention is an organic-inorganic complex sol liquid, prepared by dissolving the hydrophilic polymer having the silane coupling group at the end, and preferably the crosslinking component, in a solvent under sufficient agitation to cause hydrolysis and condensation polymerization of these components, thereby being capable of forming a hydrophilic surface layer of a high hydrophilicity and a high film strength. In the preparation of the organic-inorganic complex sol liquid, it is preferable to use an acidic catalyst or a basic catalyst in combination, in order to accelerate the hydrolysis and the condensation polymerization reaction, and the use of such catalyst is essential in order to obtain a practically preferable reaction efficiency.

As the catalyst, an acid or a basic compound may be used singly or in a state dissolved in a solvent such as water or alcohol (hereinafter respectively called acidic catalyst or basic catalyst). The concentration in dissolution in the solvent is not particularly restricted and may be suitably selected according to the characteristics of the acid or the basic compound to be employed and the desired content of the catalyst, but a higher concentration tends to provide faster hydrolysis and condensation polymerization. However, as the basic catalyst of a high concentration may result in precipitate formation in the sol liquid, the basic catalyst is desirably employed at a concentration, converted in an aqueous solution, not exceeding 1 N.

The type of the acidic catalyst or the basic catalyst is not particularly limited, but, in case the catalyst has to be employed at a high concentration, there is preferred a catalyst composed of elements which scarcely remain in the coated film after the drying.

Specific examples of the acidic catalyst include hydrogen halide such as hydrochloric acid, nitric acid, sulfuric acid, sulfurous acid, hydrogen sulfide, perchloric acid, hydrogen peroxide, carbonic acid, carboxylic acids such as formic acid or acetic acid, substituted carboxylic acids represented by a structural formula RCOOH in which R is substituted by another element or another substituent group, and solfonic acids such as benzene sulfonic acid, and those of the basic catalyst include ammonia-type bases such as aqueous ammonia solution, and amines such as ethylamine or aniline.

The hydrophilic coating liquid can be prepared by dissolving a hydrophilic polymer having a silane coupling group at the end, and preferably a crosslinking component, in a solvent such as ethanol, then adding aforementioned catalyst if desired, and executing agitation. Preferably the reaction temperature is within a range from the room temperature to 80° C., and the reaction time, namely the period of continuation of agitation, is within a range of 1 to 72 hours, and such agitation allows the two components to cause hydrolysis and condensation polymerization to obtain the organic-inorganic complex sol liquid.

The solvent to be employed in the preparation of the hydrophilic coating liquid composition including the hydrophilic polymer and preferably the crosslinking component is not particularly limited as long as these components can be uniformly dissolved or dispersed, but there is preferred an aqueous solvent such as methanol, ethanol or water.

As explained in the foregoing, the preparation of the organic-inorganic complex sol liquid (hydrophilic coating liquid composition), for forming the hydrophilic surface of the invention, is based on a sol-gel process. The sol-gel process is detailedly described in published references such as "*Sol-gel Hou No Kagaku* (Science of sol-gel process)" (S. Sakuhana; published by Agune Shofu Co. (1988)) and "Saishin sol-gel hou niyoru Kinousei Hakumaku Sakusei Gijutu (Functional thin film preparation by latest sol-gel process)" (T. Hirashima; published by Sogo Gijutsu Center (1992)), and the methods described therein can be applied to the preparation of the hydrophilic coating liquid composition of the invention.

In the hydrophilic coating liquid composition of the invention, various additives may be used according to the purpose, within an extent not affecting the effect of the invention. For example, a surfactant may be added in order to improve the uniformity of the coating liquid.

A hydrophilic surface can be formed by coating and drying the hydrophilic coating liquid composition, prepared as explained in the foregoing, on the surface of a substrate. The film thickness of the hydrophilic surface can be selected according to the purpose, but is in general, in the coating amount after drying, within a range of 0.5 to 5.0 $g/m^2$, preferably 1.0 to 3.0 $g/m^2$. A coating amount less than 0.5 $g/m^2$ is difficult to exhibit the hydrophilic effect, while a coating amount exceeding 5.0 $g/m^2$ tends to deteriorate the sensitivity or the film strength, so that both being undesirable.

[Aluminum Substrate]

The aluminum substrate to be employed in the invention is required to constitute a dimensionally stable plate member adapted for use in the planographic printing plate precursor and to be composed of aluminum at least in an outermost surface in order to form a firm hydrophilic surface, and a substrate having necessary characteristics such as strength, durability and flexibility is preferably selected in consideration of these factors. Such substrate can for example be, in addition to an aluminum plate as a representative example, a sheet material such as a plastic film (for example of polyethylene, polypropylene, polystyrene, polyethylene terephthalate, polycarbonate, polyvinylacetal, cellulose diacetate, cellulose triacetate, cellulose propionate, cellulose butyrate, cellulose acetate butyrate or cellulose nitrate), a non-aluminum metal plate (for example zinc or copper) or a paper laminated with aforementioned plastic materials, on which aluminum is evaporated or laminated.

A preferred aluminum plate is a pure aluminum plate or an alloy plate principally composed of aluminum and containing another element in a small amount, and can also be a plastic film on which aluminum is evaporated or laminated as explained in the foregoing. The another element contained in the aluminum alloy may be silicon, iron, manganese, copper, magnesium, chromium, zinc, bismuth, nickel and/or titanium. The content of another element in the alloy is 10 wt. % at highest. In the present invention, particularly preferred is pure aluminum, but there may be used aluminum containing another element in a small amount since completely pure aluminum is difficult to produce in the refining technology.

Thus, the aluminum plate employable in the invention is not specified in the composition thereof but there can be suitably utilized an aluminum plate of an already known and utilized material. The thickness of the aluminum plate to be employed in the invention is about 0.1 to 0.6 mm, preferably 0.15 to 0.4 mm, particularly preferably 0.2 to 0.3 mm.

The aluminum plate to be used as the substrate may be subjected if necessary to a surface treatment such as surface roughing or anodizing. Such surface treatment will be briefly explained in the following.

Prior to the surface roughing of the aluminum plate, there is conducted, if desired, a degreasing process for example with a surfactant, an organic solvent or an aqueous alkali solution, in order to remove pressing oil on the surface. The roughing process of the surface of the aluminum plate can be executed by various methods, for example a mechanical roughing method, a method of surface roughing by electrochemically dissolving the surface, or a method of selectively dissolving the surface chemically. For the mechanical method, there can be employed a known method such as a ball abrading method, a brush abrading method, a blast abrading method or a buff abrading method. Also as the electrochemical roughing method, there is known a method utilizing an AC current or a DC current in an electrolyte solution of hydrochloric acid or nitric acid. Also there can be utilized a method of combining the two, as shown in JP-A No. 54-63902.

Thus surface roughed aluminum plate is subjected, after alkali etched and neutralized if necessary, to an anodizing process, if desired, for improving a water holding property and an abrasion resistance of the surface. For the anodizing process of the aluminum plate, there can be employed various electrolytes capable of forming a porous oxide film. In general there is employed phosphoric acid, oxalic acid, chromic acid or a mixture thereof. The concentration of such electrolyte is suitably determined according to the type of the electrolyte.

Conditions of the anodizing process are variable depending on the electrolyte to be used and cannot be specified uniquely, but are generally considered appropriate in case a concentration of the electrolyte in solution is 1 to 80 wt. %, a solution temperature of 5 to 70° C., a current density of 5 to 60 $A/dm^2$, a voltage of 1 to 100 V, and an electrolysis time of 10 seconds to 5 minutes. In case the amount of an anodized oxide film is less than 1.0 $g/m^2$, there may result an insufficient length of run or a tendency of generating scars in a non-image area of the planographic printing plate, leading to so-called "scar smear" which is caused by ink deposition on such scars at the printing operation.

In case of employing a plastic film such as a polyester film in another preferred embodiment, it is preferred to employ a film which is roughed on a surface on which the hydrophilic surface is to be formed, in consideration of formation of the hydrophilic surface or of adhesion to a recording layer to be provided thereon. In the following there will be explained an example of preferred surface properties of the support member surface (solid surface) to be employed in the invention.

In the substrate for the support member to be employed in the invention, a preferred state of surface roughing is represented by two-dimensional roughness parameters including a center line-averaged roughness (Ra) of 0.1 to 1 μm, a maximum height (Ry) of 1 to 10 μm, a ten-point averaged roughness (Rz) of 1 to 10 μm, an average distance of irregularities (Sm) of 5 to 80 μm, an average distance of local peaks (S) of 5 to 80 μm, a maximum height (Rt) of 1 to 10 μm, a center line peak height (Rp) of 1 to 10 μm and a center line valley depth (Rv) of 1 to 10 μm, and there is preferred a state satisfying one or more of these conditions and more preferred a state satisfying all these conditions.

The two-dimensional roughness parameters mentioned above are defined in the following manner:

[Center-line averaged roughtness (Ra)] A value obtained by extracting a portion of a measured length L from a roughness curve in a direction of a center line, and by arithmetically averaging the absolute value of a deviation between the center line of extraction and the roughness curve.

[Maximum height (Ry)] A value obtained by extracting a reference length from the roughness curve in a direction of an average line thereof and measuring the distance between a peak line and a valley line of the extracted portion, in a direction of a vertical magnification of the roughness curve.

[Ten point-averaged roughness (Rz)] A value obtained by extracting a reference length from the roughness curve in a direction of an average line thereof, and representing a sum, in micrometers (μm), an average value of absolute heights (Yp) of a highest peak to a fifth highest peak and an average value of absolute heights (Yv) of a lowest valley to a fifth lowest valley, measured from an average line of the extracted portion in a direction of a vertical magnification.

[Average distance of irregularities (Sm)] A value obtained by extracting a reference length from the roughness curve in a direction of an average line thereof, determining the sum of average lines each corresponding to a peak and an adjacent valley in the extracted portion and representing the arithmetic average of the distances of such plural irregularities in micrometers (μm).

[Average distance of local peaks (S)] A value obtained extracting a reference from the roughness curve in a direction of an average line thereof, determining the length of an average line corresponding to adjacent local peaks in the extracted portion and representing the arithmetic average of the plural distances between the plural local peaks in micrometers (μm).

[Maximum height (Rt)] A value obtained by extracting a reference length from the roughness curve and representing the distance of two lines parallel to the center line of the extracted portion and sandwiching the extracted portion.

[Center line peak height (Rp)] A value obtained by extracting a measured length L from the roughness curve in a direction of a center line thereof and representing the distance between such extracted portion and a line parallel to the center line of the extracted portion and passing through a highest peak.

[Center line valley height (Rp)] A value obtained by extracting a measured length L from the roughness curve in a direction of a center line thereof and representing the distance between such extracted portion and a line parallel to the center line of the extracted portion and passing through a deepest valley.

(Surface Roughing Process)

The method for roughing the surface of the substrate can representatively be the aforementioned aluminum surface treating process, but the chemical or electrical processing method is applicable only in case an aluminum plate itself is employed as the substrate. Therefore, for example for treating the surface of a composite substrate such as plastics evaporated with aluminum, it is preferred to employ other known roughing methods such as aforementioned mechanical roughing method. Examples of such roughing method include a method of mechanically abrading the surface of the substrate by sand blasting or brushing to form recessed portions thereby forming a rough surface. Such methods may be employed singly or in a combination of plural methods.

Among these, particularly preferred is a sand blasting method.

Sand Blasting Method

Sand blasting is to project a grinding material in fine particles at a high speed onto the surface of the substrate thereby forming irregularities on the surface, and, more specifically, the sand blast process executes surface treatment by blowing a grinding material to the surface of the substrate by compressed air, wherein the irregularities formed by this process are regulated by conditions of the sand blast process. The sand blast process can be a known process, which achieves the objective for example by strongly blowing carborundum (silicon carbide powder) or metal particles together with compressed air to the surface followed by rinsing and drying.

In the sand blast process, the center line averaged surface roughness of the substrate can be controlled by a particle size of the blown particles and a process amount (process frequency per unit area), and becomes larger as the particle size of the particles increases or as the process amount increases.

In blowing the grinding material from a sand blasting nozzle, it is necessary to regulate, as the process conditions, a blasting amount of the grinding material (blast amount), and an angle and a distance between the sand blasting nozzle and the substrate surface (blasting angle, blasting distance). The grinding material in a hopper is blown from the sand blasting nozzle by compressed air supplied from an air chamber onto the surface of the substrate, thereby achieving the sand blasting process under appropriate conditions. Specifically, these methods are described as known methods for example in JP-A Nos. 8-34866, 11-90827 and 11-254590.

The process conditions in such sand blast process have to be so selected that the grinding material or ground substances do not remain on the substrate surface after the process and that the strength of the substrate itself is not deteriorated, but such process conditions can be suitably selected empirically.

More specifically, for example silica sand is used as the grinding material, and it is preferable to use silica sand of a particle size within a range of 0.05 to 10 mm, more preferably 0.1 to 11 mm. It is also preferable to employ a blasting distance of 100 to 300 mm, a blasting angle of 45° to 90°, more preferably 45° to 60°, and a blasting amount of 1 to 10 kg/min. Such conditions are selected in order that the grinding material and the ground substance does not remain on the substrate surface in the sand blast process and in order to control the grinding depth. The grinding depth is preferably maintained within a range of 0.01 to 0.1 μm, and, within such range, there can be avoided a situation where the strength of the substrate itself is deteriorated by the grinding and cannot be maintained at a practical level.

<Positive Working Recording Layer Showing an Increase in Solubility in Aqueous Alkali Solution Upon Exposure to Light>

The planographic printing plate precursor of the invention is formed by providing, on aforementioned support member, a positive working recording layer to be explained in the following. The positive working recording layer in the planographic printing plate precursor of the invention includes a substance capable of absorbing light and generating heat, and a polymer compound which is insoluble in water but soluble in alkali and which increases solubility in alkaline aqueous solution upon exposure to light.

In the following components employed in the positive working recording layer will be explained.

[Substance Absorbing Light and Generating Heat]

The substance capable of absorbing light and generating heat (hereinafter called a photothermal converting substance) to be employed in the invention can be any substance capable of absorbing an optical energy radiation employed in recording and generating heat, without particular limitation on the absorption wavelength range, but, in consideration of matching with an easily available high power laser, there is preferably employed an infrared absorbing dye or an infrared absorbing pigment, having an absorption maximum in a wavelength region of 760 to 1200 nm.

The dye usable as the photothermal converting material in the invention can be commercially available dyes and known ones described for example in "*Senryo Binran* (Dye Handbook)" (edited by Organic Synthetic Chemical Society, 1970). Specific examples of such dye include azo dyes, metal complex azo dyes, pyrazolone azo dyes, naphthoquinone dyes, anthraquinone dyes, phthalocyanine dyes, carbonium dyes, quinonimine dyes, methine dyes, cyanine dyes, squalirium dyes, pyrilium dyes, metal thiolate dyes, oxonol dyes, diimonium dyes, aminium dyes and chroconium dyes.

Preferred dyes include cyanine dyes described in JP-A Nos. 58-125246, 59-84356, 59-202829 and 60-78787, methine dyes described in JP-A Nos. 58-173696, 58-181690 and 58-194595, naphthoquinone dyes described in JP-A Nos. 58-112793, 58-224793, 59-48187, 59-73996, 60-52940 and 60-63744, squalirium dyes described in JP-A No.58-112792 and cyanine dyes described in BP No. 434,875.

There can also be advantageously employed a near infrared absorption sensitizer described in U.S. Pat. No. 5,156,938, and there can be preferably employed substituted arylbenzo(thio)pyrilium salts described in U.S. Pat. No. 3,881,924, trimethinethiapyrilium salts described in JP-A No. 57-142645 (U.S. Pat. No. 4,327,169), pyrilium compounds described in JP-A Nos. 58-181051, 58-220143, 59-41363, 59-84248, 59-84249, 59-146063 and 59-146061, cyanine dyes described in JP-A-59-216146, pentamethinethiopyrilium salts described in U.S. Pat. No. 4,283,475 and pyrilium compounds described in JP-B No. 5-13514 and 5-19702.

Also another preferred example of the dye is near infrared absorbing dyes described in U.S. Pat. No. 4,756,993 by formulas (I) and (II).

Among these dyes, particularly preferred are cyanine dyes, phthalocyanine dyes, oxonol dyes, squalirium dyes, pyrilium salts, thiopyrilium dyes and nickel thiolate complexes. Further, dyes represented by following general formula (a) to (e) are preferred because of an excellent photothermal converting efficiency, and, a cyanine dye represented by a following general formula (a) is most preferable as it provides a high polymerization activity and is excellent in stability and economy when employed in a polymerizable composition to be used in the invention.

General Formula (a)

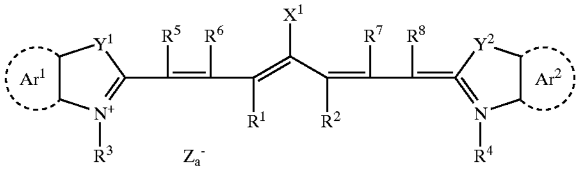

In the general formula (a), $X^1$ represents a hydrogen atom, a halogen atom, —$NPh_2$, $X_2$–$L_1$ or a following group; $X_2$ represents an oxygen atom or a sulfur atom; $L_1$ represents a hydrocarbon group with 1 to 12 carbon atoms, an aromatic ring having a hetero atom or a hydrocarbon group with 1 to 12 carbon atoms including a hetero atom; and a hetero atom is N, S, O, a halogen atom or Se.

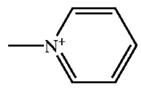

$R^1$ and $R^2$ each independently represents a hydrocarbon group of 1 to 12 carbon atoms. In consideration of stability in storage of the recording layer coating liquid, each of $R^1$ and $R^2$ is preferably a hydrocarbon group with 2 or more carbon atoms, and more preferably $R^1$ and $R^2$ are mutually bonded to form a five-membered ring or a six-membered ring.

$Ar^1$ and $Ar^2$, which may be same or different, each represents an aromatic hydrocarbon group which may have a substituent. Preferred examples of the aromatic hydrocarbon group include a benzene ring and a naphthalene ring. Also preferred examples of the substituent include a hydrocarbon group with 12 or less carbon atoms, a halogen atom, and an alkoxy group with 12 or less carbon atoms. $Y^1$ and $Y^2$, which may be same or different, each represents a sulfur atom or a dialkylmethylene group with 12 or less carbon atoms. $R^3$ and $R^4$, which may be same or different, each represents a hydrocarbon group with 20 or less carbon atoms, which may have a substituent. preferred examples of the substituent include an alkoxy group with 12 or less carbon atoms, a carboxyl group and a sulfo group. $R^5$, $R^6$, $R^7$ and $R^8$, which may be same or different, each represents a hydrogen atom, or a hydrocarbon group with 12 or less carbon atoms. Hydrogen atom is preferred because of the availability of the raw material. Za- represents a counter anion. However, Za- is not required in case any of $R^1$ to $R^8$ is substituted with a sulfo group. In consideration of the stability in storage of the recording layer coating liquid, Za- is preferably a halogen ion, a perchlorate ion, a tetrafluoroborate ion, a hexafluorophosphate ion, or a sulfonate ion, and more preferably a perchlorate ion, a hexafluorophosphate ion or an arylsulfonate ion.

Specific examples of the cyanine dyes represented by the general formula (a) and advantageously employable in the invention are described, in addition to those shown in the following, in paragraphs [0017] to [0019] of Japanese Patent Application No. 11-310623, paragraphs [0012] to [0038] of Japanese Patent Application No. 2000-224031, and paragraphs [0012] to [0023] of Japanese Patent Application No. 2000-211147.

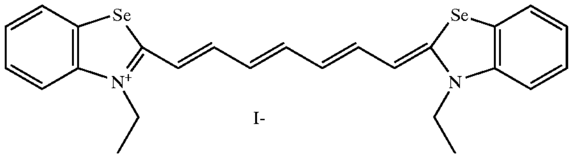

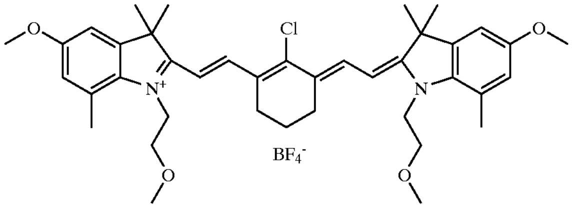

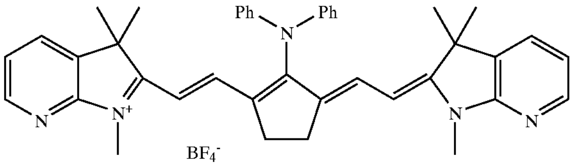

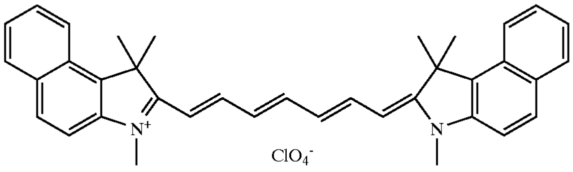

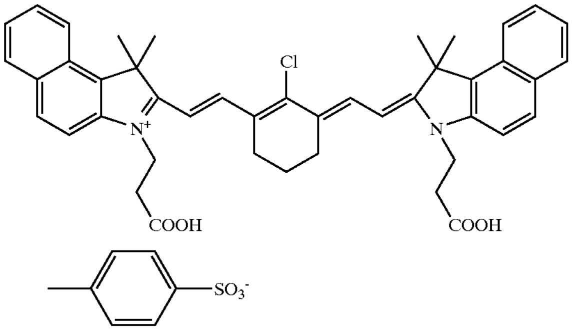

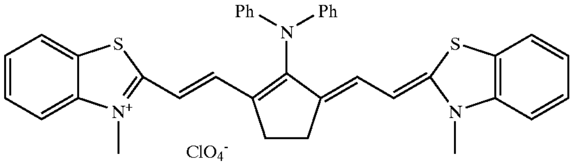

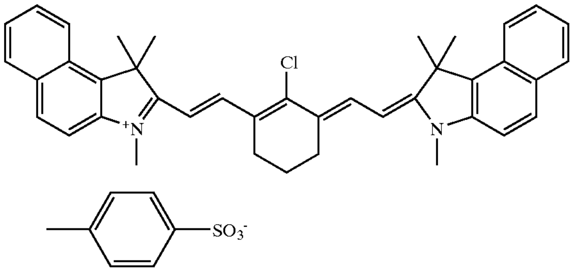

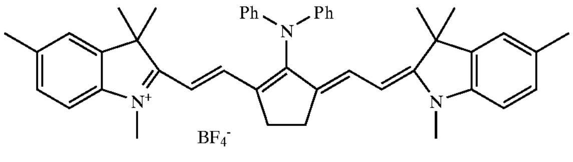

-continued

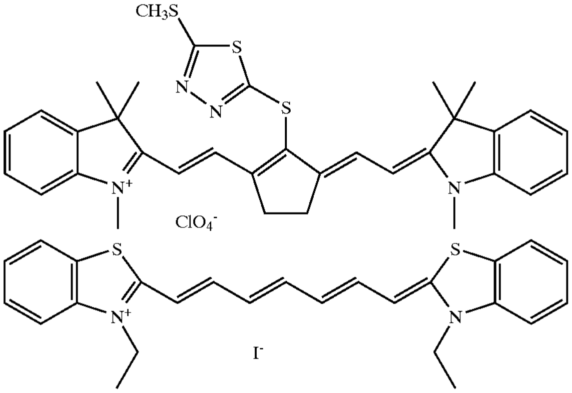

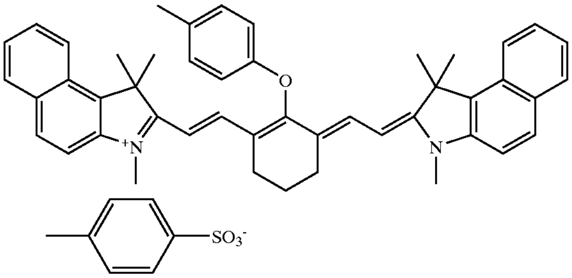

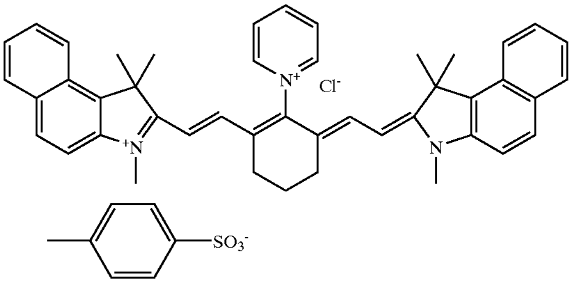

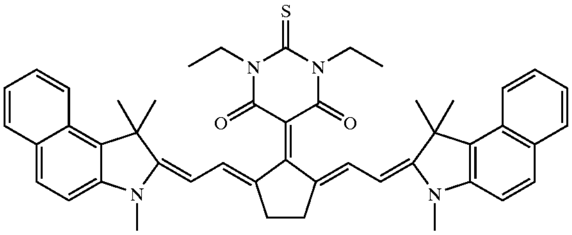

General Formula (b)

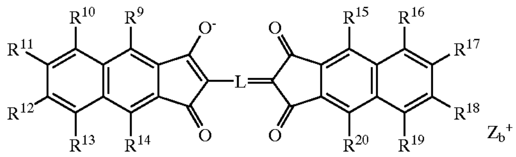

In the foregoing general formula (b), L represents a methine chain with 7 or more conjugate carbon atoms in which the methine chain may have substituent(s) and the substitutents may be mutually bonded to form a ring structure. $Zb^+$ represents a counter cation. Preferred examples of the counter cation include ammonium, iodonium, sulfonium, phosphonium, pyridinium and an alkali metal cation ($Ni^+$, $K^+$, $Li^+$). $R^9$ to $R^{14}$ and $R^{15}$ to $R^{20}$ each independently represents a substituent group selected from a hydrogen atom, a halogen atom, a cyano group, an alkyl group, an aryl group, an alkenyl group, an alkinyl group, carbonyl group, a thio group, a sulfonyl group, a sulfinyl group, an oxy group and an amino group, or a substituent group formed by a combination of two or three of these groups, and they may be mutually bonded to form a ring structure. Among those represented by the general formula (b), there is preferred one in which L represents a methine chain with 7 conjugate carbon atoms and $R^9$ to $R^{14}$ and $R^{15}$ to $R^{20}$ all represent hydrogen atoms in consideration of the availability and the effect.

Specific examples of the dye represented by the general formula (b) and advantageously employable in the invention are shown in the following:

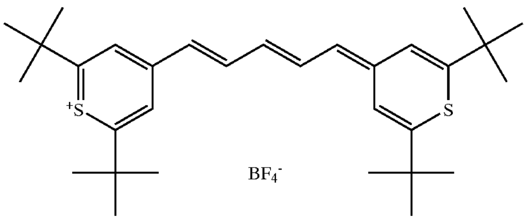

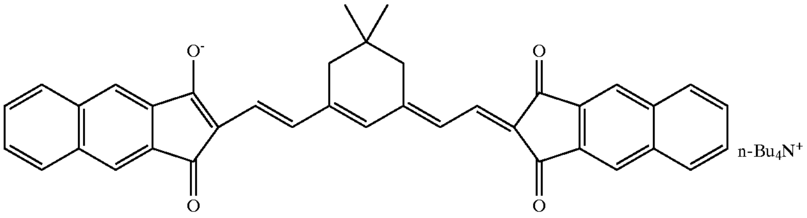

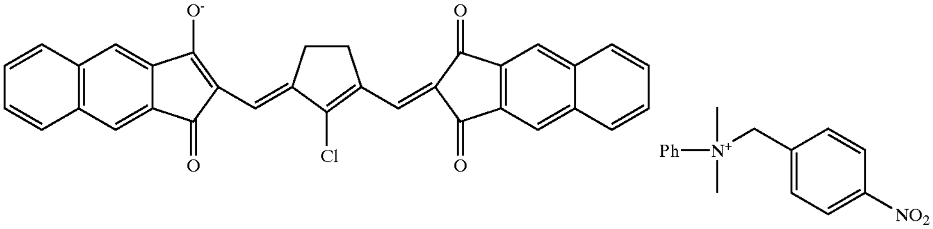

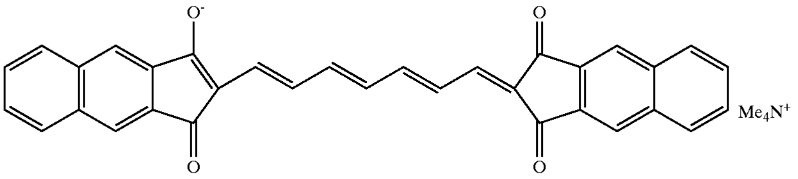

General Formula (c)

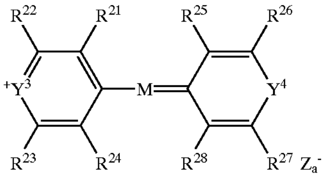

In the general formula (c), $Y^3$ and $Y^4$ each represents an oxygen atom, a sulfur atom, a selenium atom or a tellurium atom; M represents a methine group with 5 or more conjugate carbon atoms; $R^{21}$ to $R^{24}$ and $R^{25}$ to $R^{28}$, which may be same or different, each represents a hydrogen atom, a halogen atom, a cyano group, an alkyl group, an aryl group, an alkenyl group, an alkinyl group, a carbonyl group, a thio group, a sulfonyl group, a sulfinyl group, an oxy group or an amino group; and Za- represents a counter anion and has the same meaning as Za- in the general formula (a).

Specific examples of the dye represented by the general formula (c) and advantageously employable in the invention are shown in the following:

-continued

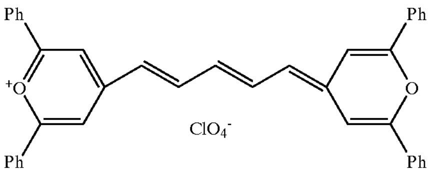

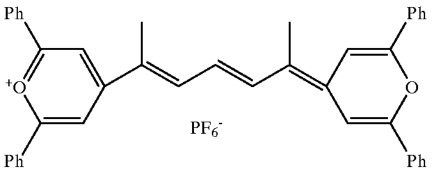

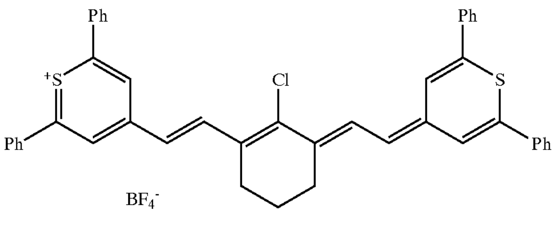

-continued

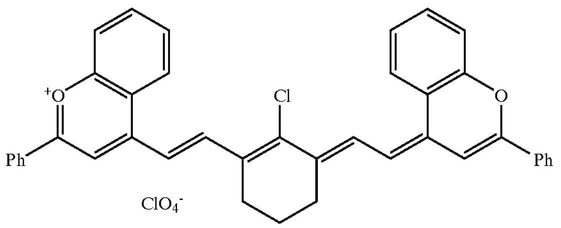

General Formula (d)

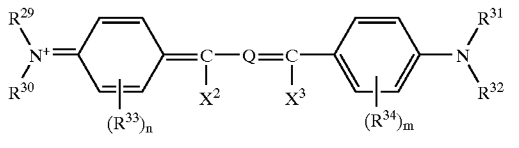

In the general formula (d), $R^{29}$ to $R^{31}$ each independently represents a hydrogen atom, an alkyl group or an aryl group; $R^{33}$ and $R^{34}$ each independently represents an alkyl group, a substituted oxy group or a halogen atom; n and m each independently represents an integer from 0 to 4; $R^{29}$ and $R^{30}$, or $R^{31}$ and $R^{32}$ may be respectively bonded to form a ring, also $R^{29}$ and/or $R^{30}$ may be bonded with $R^{33}$ to form a ring, and $R^{31}$ and/or $R^{32}$ may be bonded with $R^{34}$ to form a ring, and in case $R^{33}$ or $R^{34}$ is present in plural units, such $R^{33}$S or $R^{34}$S may be respectively bonded to form a ring; $X^2$ and $X^3$ each independently represents a hydrogen atom, an alkyl group or an aryl group and at least either of $X^2$ and $X^3$ represents a hydrogen atom or an alkyl group; Q represents a trimethine group or a pentamethine group which may be substituted and which may form a ring structure with a divalent organic group; and Zc- represents a counter anion and has the same meaning as Za- in the general formula (a).

Specific examples of the dye represented by the general formula (d) and advantageously employable in the invention are shown in the following:

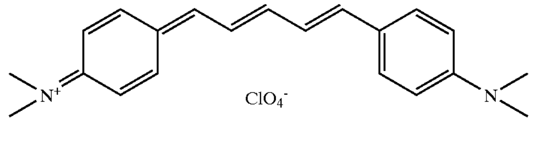

-continued

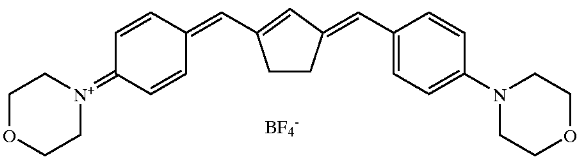

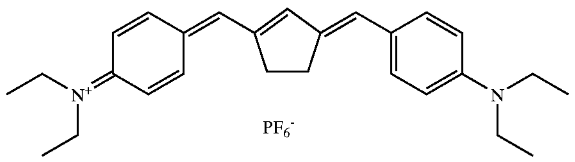

General Formula (e)

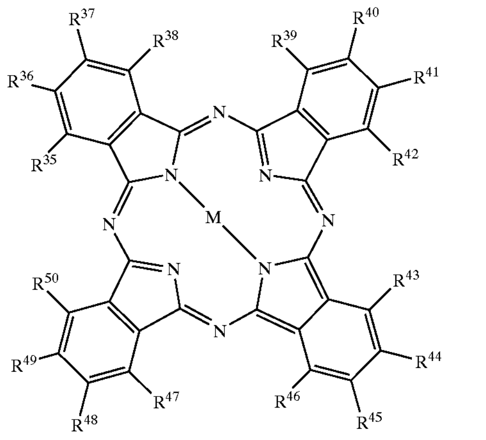

In the general formula (e), $R^{35}$ to $R^{50}$ each independently represents a hydrogen atom, a halogen atom, a cyano group, an alkyl group, an aryl group, an alkenyl group, an alkinyl group, a hydroxyl group, a carbonyl group, a thio group, a sulfonyl group, a sulfinyl group, an oxy group, an amino group or an onium salt structure, which may have a substituent group. M represents two hydrogen atoms, a metal atom, a halometal group or an oxymetal group, in which the metal atom contained therein can be an atom of group IA, IIA, IIIB or IVB of the periodic table, a transition metal of the first, second or third cycle, or a lanthanoid element, among which preferred is copper, magnesium, iron, zinc, cobalt, aluminum, titaniumorvanadium.

Specific examples of the dye represented by the general formula (e) and advantageously employable in the invention are shown in the following:

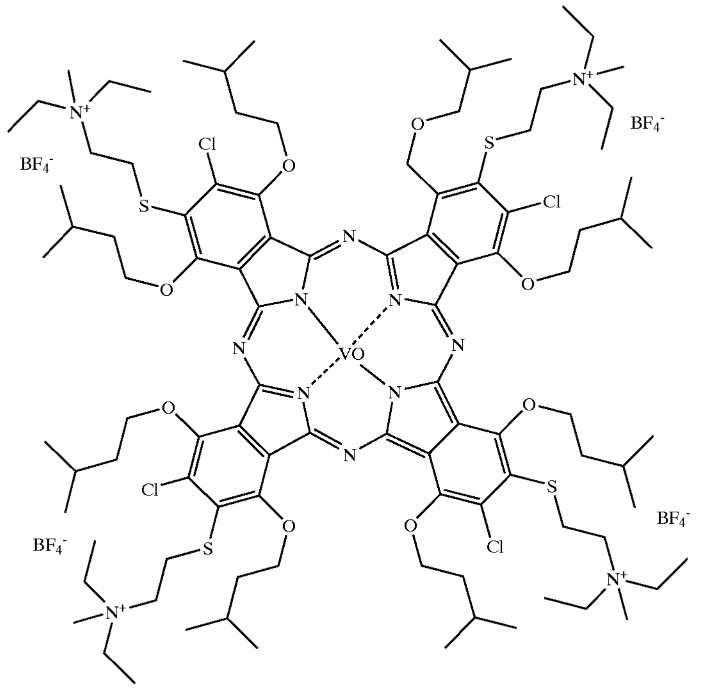

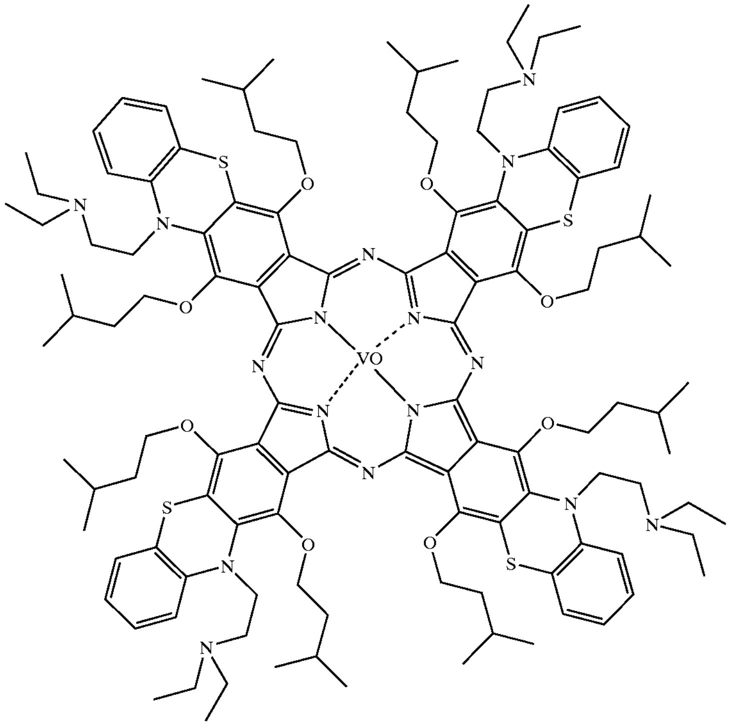

Examples of the pigment employable as the photothermal converting material in the invention include commercially available pigments and pigments described in Color Index (C. I.), "*Saishin Ganryo Binran* (Latest Pigment Handbook)" (Pigment Technology Society of Japan, 1977), "*Saishin Ganryo Ouyou Gijutsu* (Latest Pigment Application Technology)" (CMC Press, 1986), and "*Insatsu Ink Gijutsu* (Printing Ink Technology)" (CMC Press, 1984).

The type of the pigment can be a black pigment, a yellow pigment, an orange pigment, a brown pigment, a red pigment, a purple pigment, a blue pigment, a green pigment, a fluorescent pigment, a metal power pigment, or a polymer bonded pigment. Specific examples include insoluble azo pigments, azo rake pigments, condensed azo pigments, chelate azo pigments, phthalocyanine pigments, anthraquinone pigments, perylene and perynone pigments, thioindigo pigments, quinachrydone pigments, dioxazine pigments, isoindolinone pigments, quinophthalone pigments, vat rake pigments, azine pigments, nitroso pigments, nitro pigments, natural pigments, fluorescent pigments, inorganic pigments and carbon black, among which preferred is carbon black.

These pigments may be used with or without a surface treatment. The surface treating method can be, for example, a method of surface coating with resin or wax, a method of depositing a surfactant, or a method of bonding a reactive substance (for example a silane coupling agent, an epoxy compound or polyisocyanate) to the pigment surface. These surface treating methods are described in "*Kinzoku Sekken no Seishitsu to Ouyou* (Properties and Applications of Metal Soaps)" (Saiwai Shobo), "*Insatsu Ink Gijutsu* (Printing Ink Technology)" (CMC Press, 1984) and "*Saishin Ganryo Ouyou Gijutsu* (Latest Pigment Application Technology)" (CMC Press, 1986).

The particle size of the pigment is preferably within a range of 0.01 to 10 μm, more preferably 0.05 to 1 μm and most preferably 0.1 to 1 μm. A particle size of the pigment less than 0.01 μm is undesirable in the stability of dispersion in the recording layer coating liquid, and a particle size exceeding 10 μm is undesirable in the uniformity of the recording layer.

For dispersing the pigment, there can be used a known technology employed in ink manufacture or toner manufacture. A dispersing machine can be an ultrasonic dispersing device, a sand mill, an Atliter, a pearl mill, a super mill, a ball mill, an inpeller, a disperser, a KD mill, a colloid mill, a dynatron, a three-roll mill or a pressurized kneader. Details are described in "*Saishin Ganryo Ouyou Gijutsu* (Latest Pigment Application Technology)" (CMC Press, 1986).

Such pigment or dye may be added, to all the solids constituting the positive working recording layer, in an amount of 0.01 to 50 wt. %, preferably 0.1 to 10 wt. %, and particularly preferably 0.5 to 10 wt. % in case of a dye or particularly preferably 0.1 to 10 wt. % in case of a pigment. An addition amount of the pigment or the dye less than 0.01 wt. % reduces the effect of sensitivity improvement, while an addition amount exceeding 50 wt. % loses the uniformity of the recording layer and deteriorates the durability.

[Polymer Compound Insoluble in Water and Soluble in Alkali]

In the invention, the polymer compound insoluble in water and soluble in alkali (hereinafter suitably called alkali soluble polymer) to be employed in the positive working recording layer includes a homopolymer having an acidic group in a main chain and/or a side chain of the polymer, a copolymer thereof and a mixture thereof. Consequently, the recording layer of the invention has a property of being dissolved upon contact with an alkaline developing solution.

The alkali soluble polymer to be used in the positive working recording layer of the invention can be any known one without any limitation. Among these there is preferred one having an acidic group, shown in (1) to (6) in the following, in the main chain and/or in the side chain of the polymer, in the solubility in the alkaline developing solution:

(1) phenolic hydroxyl group (—Ar—OH)

(2) sulfonamide group ($—SO_2NH—R$)

(3) substituted sulfonamide acidic group (hereinafter called "active imide group") [$—SO_2NHCOR$, $—SO_2NHSO_2R$, $—CONHSO_2R$]

(4) carboxylic acid group ($—CO_2H$)

(5) sulfonic acid group ($—SO_3H$)

(6) phosphoric acid group ($—OPO_3H_2$)

Among (1) to (6), Ar represents a divalent aryl connecting group which may be substituted, and R represents a hydrocarbon group which may be substituted.

Among the alkali soluble polymers having the acidic group selected from (1) to (6), there is preferred an alkali soluble polymer having (1) a phenol group, (2) a sulfonamide group or (3) an active imide group, and particularly preferred is an alkali soluble polymer having (1) a phenol group or (2) a sulfonamide group for sufficiently securing the solubility in the alkaline developing solution and the film strength.

In the following there will be explained representative examples of polymerizing components of such alkali soluble polymer compound.

(1) A polymerizable monomer having a phenolic hydroxyl group can be a polymerizable monomer composed of a low molecular compound having at least a phenolic hydroxyl group and at least a polymerizable unsaturated bond, such as acrylamide, methacrylamide, an acrylic acid ester, a methacrylic acid ester or hydroxystyrene, having a phenolic hydroxyl group.

Specific examples include N-(2-hydroxyphenyl) acrylamide, N-(3-hydroxyphenyl)acrylamide, N-(4-hydroxyphenyl)acrylamide, N-(2-hydroxyphenyl) methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, and 2-(4-hydroxyphenyl)ethyl methacrylate. These monomers having phenolic hydroxyl group may be used in a combination of two or more kinds.

(2) A polymerizable monomer having a sulfonamide group can be a polymerizable monomer composed of a low molecular compound having at least a sulfonamide group in which at least a hydrogen atom is bonded to a nitrogen atom in a molecule (—NH—SO2-) and at least a polymerizable unsaturated bond, for example a low molecular compound having an acryloyl group, an allyl group and a vinyloxy group, and a substituted or mono-substituted aminosulfonyl group or a substituted sulfonylimino group. Such compound can be those indicated by general formulas (I) to (V) in JP-A No. 8-123029.

Specifically, there can be advantageously employed m-aminosulfonylphenyl methacrylate, N-(p-aminosulfonylphenyl) methacrylamide or N-(p-aminosulfonylphenyl) acrylamide.

(3) A polymerizable monomer having an active imide group is preferably a compound having an active imide group described in JP-A No. 11-84657 in the molecule, and can be a polymerizable monomer composed of a low molecular compound having at least an active imide group and at least a polymerizable unsaturated bond.

Specifically, there can be advantageously employed N-(p-toluenesulfonyl) methacrylamide or N-(p-toluenesulfonyl) acrylamide.

(4) An alkali soluble polymer having a carboxylic acid group can be a polymer of which a principal structural component is constituted by a minimum structural unit derived from a compound having at least a carboxylic acid group and at least a polymerizable unsaturated group in the molecule.

(5) An alkali soluble polymer having a sulfonic acid group can be a polymer of which a principal structural component is constituted by a minimum structural unit derived from a compound having at least a sulfonic acid group and at least a polymerizable unsaturated group in the molecule.

(6) An alkali soluble polymer having a phosphoric acid group can be a polymer of which a principal structural component is constituted by a minimum structural unit derived from a compound having at least a phosphoric acid group and at least a polymerizable unsaturated group in the molecule.

The minimum structural unit having an acidic group selected from foregoing (1) to (6), for constituting the alkali soluble polymer to be used in the positive working recording layer of the planographic printing plate precursor of the invention, need not be limited to a single kind, but it is also possible to copolymerize two or more minimum structural units having a same acidic group or two or more minimum structural units having different acidic groups.

For the copolymerization, there can be utilized graft copolymerization, block copolymerization or random copolymerization, already known in the art.

The above-mentioned copolymer contains the copolymerized compound having the acidic group selected from (1) to (6) preferably in a content of 10 mol. % or higher, more preferably 20 mo.% or higher. A content less than 10 mol. % may result in an insufficient solubility in alkali, thus becoming incapable of achieving a sufficient improvement in the developing latitude.

A monomer component to be copolymerized with the compound having an acidic group selected from foregoing (1) to (6) can be, for example, compounds shown in following (m1) to (m12), but is not limited to such examples:

(m1) acrylic acid esters and methacrylic acid esterss having an aliphatic hydroxyl group, such as 2-hydroxyethyl acrylate or 2-hydroxyethyl methacrylate;

(m2) alkyl acrylates such as methyl acrylate, ethyl acrylate, propyl acrylate, butyl acrylate, amyl acrylate, hexyl acrylate, octyl acrylate, benzyl acrylate, 2-chloroetyl acrylate or glycidyl acrylate;

(m3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroetyl methacrylate or glycidyl methacrylate;

(m4) acrylamides or methacrylamides such as acrylamide, methacrylamide, N-methylol acrylamide, N-ethylacrylamide, N-hexylmethacrylamide, N-cyclohexylacrylamide, N-hydroxyethylacrylamide, N-phenylacrylamide, N-nitrophenylacrylamide, or N-ethyl-N-phenylacrylamide;

(m5) vinylethers such as ethylvinylether, 2-chloroethylvinylether, hydroxyethylvinylether, propylvinylether, butylvinylether, octylvinylether, or phenylvinylether;

(m6) vinyl esters such as vinyl acetate, vinyl chloroacetate, vinyl butyrate or vinyl benzoate;

(m7) styrenes such as styrene, α-methylstyrene, methylstyrene, or chloromethylstyrene;

(m8) vinylketones such as methylvinylketone, ethylvinylketone, propylvinylketone or phenylvinylketone;

(m9) olefins such as ethylene, propylene, isobutylene, butadiene, or isoprene;

(m10) N-vinylpyrrolidone, acrylonitrile or methacrylonitrile;

(m11) unsaturated imides such as maleimide, N-acryloylacrylamide, N-acetylmethacrylamide, N-propionylmethacrylamide or N-(p-chlorobenzoyl) methacrylamide;

(m12) unsaturated carboxylic acids such as acrylic acid, methacrylic acid, maleic anhydride or itaconic acid.

The alkali soluble polymer preferably has a phenolic hydroxyl group in view of an excellent image forming property by an exposure for example with an infrared laser, and preferred examples include novolac resins such as phenol formaldehyde resin, m-cresol formaldehyde resin, p-cresol formaldehyde resin, m-/p-mixed cresol formaldehyde resin, or phenol/cresol (m-, p- or m-/p-mixed) mixed formaldehyde resin, or pyrrgallol aceton resins.

Also the alkali soluble polymer compound having the phenolic hydroxyl group can be, in addition to the compounds shown in the foregoing, a condensation polymer of a phenol having an alkyl group of 3 to 8 carbon atoms as a substituent and formaldehyde, such as t-butylphenol formaldehyde resin or octylphenol formaldehyde resin as described in U.S. Pat. No. 4,123,279.

For copolymerizing the alkali soluble polymer compound, there may be employed a method known in the art, such as graft copolymerization, block copolymerization or random copolymerization.

In the invention, the alkali soluble polymer, in case it is a homopolymer or a copolymer of a polymerizable monomer having a phenolic hydroxyl group, a polymerizable monomer having a sulfonamide group or a polymerizable monomer having an active imide group, preferably has a weight-averaged molecular weight of 2,000 or higher and a number-averaged molecular weight of 500 or higher. More preferably the weight-averaged molecular weight is from 5,000 to 300,000, the number-averaged molecular weight is from 800 to 250,000, and a dispersion degree (weight-averaged molecular weight/number-averaged molecular weight) is from 1.1 to 10.

In the invention, the alkali soluble polymer, in case it is a resin such as phenol formaldehyde resin or cresol formaldehyde resin, preferably has a weight-averaged molecular weight from 500 to 20,000 and a number-averaged molecular weight from 200 to 100,000.

These alkali soluble polymer compounds maybe used singly or in a combination of two or more kinds, and are used in an addition amount, with respect to the total solids in the recording layer, of 30 to 99 wt. %, preferably 40 to 95 wt. % and particularly preferably 50 to 90 wt. %. An addition amount of the alkali soluble polymer less than 30 wt. % deteriorates the durability of the thermal recording layer, while an addition amount exceeding 99 wt. % is undesirable both in the sensitivity and the durability.

[Other Components]

In forming the positive working recording layer to be employed in the invention, various additives may be further added according to the necessity. For example, it is preferable, for enhancing the inhibition of dissolution of an image portion in the developer, to use in combination a substance which is thermally decomposable and is capable, in an undecomposed state, of substantially reducing the solubility of the alkali soluble polymer compound, such as an onium salt, an o-quinonediazide compound, an aromatic sulfone compound or an aromatic sulfonic acid ester. Examples of onium salt include a diazonium salt, an ammonium salt, a phosphonium salt, a iodonium salt, a sulfonium salt, a selenonium salt and an arsonium salt.

Preferred examples of the onium salt to be employed in the invention include diazonium salts described by S. I. Schlesinger, Photogr. Sci. Eng., 18, 387(1974), T. S. Bal et al., Polymer, 21, 423(1980) and in JP-A No. 5-158230; ammonium salts described in U.S. Pat. Nos. 4,069,055 and 4,069,056 and JP-A No.3-140140; phosphonium salts described by D. C. Necker et al., Macromolecules, 17, 2468(1984), C. S. Wen et al., Tch. Proc. Conf. Rad. Curing ASIA, p478 Tokyo, Oct(1988), U.S. Pat. Nos. 4,069,055 and 4,069,056; iodonium salts described by J. V. crivello et al., Macromolecules, 10(6), 1307(1977), Chem & Eng. News, Nov. 28, p31(1988), European Patent No. 104,143, U.S. Pat. Nos. 5,041,358 and 4,491,628, JP-A Nos. 2-150848 and 2-296514; sulfonium salts described by J. V. Crivello et al., Polymer J. 17, 73(1988), J. V. Crivello et al., J. Org. Chem., 43, 3055(1978), W. R. Watt et al., J. Polymer Sci., Polymer Chem. ed., 22, 1789(1984), J. V. Crivello et al., Polymer Bull., 14, 279(1985), J. V. Crivello et al., Macromolecules, 14(5), 1141(1981), J. V. Crivello et al., J. Polymer Sci., Polymer Chem. Ed., 17, 2877(1979), European Patents Nos. 370,693, 233,567, 297,443 and 297,442, U.S. Pat. Nos. 4,933,377, 3,902,114, 4,491,628, 5,041,358, 4,760,013, 4,734,444 and 2,833,827, German patents Nos. 2,904,626, 3,604,580 and 3,604,581; selenonium salts described by J. V. Crivello et al., Macromolecules, 10(6), 1307(1977), J. V. Crivello et al., J. Polymer Sci., Polymer Chem. Ed., 17, 1047(1979); and arsonium salts described by C. S. Wenetal., Teh. Proc. Conf. Rad. Curing ASIA, p478 Tokyo, Oct(1988).

Among the onium salts, diazonium salts are particularly preferred. Particularly preferred diazonium salts can be those described in JP-A No. 5-158230.

As a counter ion to the onium salt, there can be employed, for example, tetrafluoroboric acid, hexafluorophosphoric acid, triisopropylnaphthalene sulfonic acid, 5-nitro-o-toluene sulfonic acid, 5-sulfosalicylic acid, 2,5-dimethylbenzene sulfonic acid, 2,4,6-trimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, or paratoluene sulfonic acid. Among these, particularly preferred is hexafluorophosphoric acid or an alkylaromatic sulfonic acid such as triisopropyl-naphthalene sulfonic acid or 2,5-dimethylbenzene sulfonic acid.

As a preferred quinonediazide, there can be employed an o-quinonediazide compound. The o-quinonediazide compound employable in the invention has at least an o-quinonediazide group and increases solubility in alkali by pyrolysis, and can assume various structures. The quinonediazide enhances the solubility of the photosensitive system by both effects that the o-quinonediazide loses a dissolution suppressing ability of a binder upon pyrolysis and that o-quinonediazide itself changes to an alkali-soluble substance. As such o-quinonediazide compound employable in the invention, there can be used compounds described in J. Cosar, "Light-sensitive Systems" (John Wiley & Sons. Inc.), p. 339-352, and there can be particularly advantageously employed a sulfonic acid ester or a sulfonic acid amide of o-quinonediazide obtained by reacting with various aromatic polyhydroxy compounds or aromatic amino compounds. There can also be advantageously employed an ester of benzoquinone-(1,2)-diazide sulfonic acid chloride or naphthoquinone-(1,2)-diazide-5-sulfonic acid chloride with pyrogallol-acetone resin as described in JP-B No. 43-28403, and an ester of benzoquinone-(1,2)-diazidesulfonic acid chloride or naphthoquinone-(1,2)-diazide-5-sulfonic acid chloride and phenol-formaldehyde resin as described in U.S. Pat. Nos. 3,046,120 and 3,188,210.

There can also be advantageously employed an ester of naphthoquinone-(1,2)-diazide-4-sulfonic acid chloride and phenol-formaldehyde resin or cresol-formaldehyde resin, or an ester of naphthoquinone-(1,2)-diazide-4-sulfonic acid chloride and pyrogallol-acetone resin. Other useful o-quinonediazide compounds are known and reported in various patents, for example JP-A Nos. 47-5303, 48-63802, 48-63803, 48-96575, 49-38701 and 48-13354, JP-B Nos. 41-11222, 45-9610 and 49-17481, U.S. Pat. Nos. 2,797,213, 3,454,400, 3,544,323, 3,573,917, 3,674,495 and 3,785,825, British Patents Nos. 1,227,602, 1,251,345, 1,267,005, 1,329,888 and 1,330,932 and German Patent No. 854,890.

The amount of addition of o-quinonediazide compounds is, with respect to the total solids of the printing plate materials, preferably 1 to 50 wt. %, more preferably 5 to 30 wt. % and most preferably 10 to 30 wt. %. These compounds may be used singly or in a mixture of plural kinds.

The addition amount of additives other than o-quinonediazide compound is preferably 1 to 50 wt. %, more preferably 5 to 30 wt. %, most preferably 10 to 30 wt. %. The additives and the binder employed in the invention may be contained in a same layer.

Also, for further improving the sensitivity, there can be used a cyclic acid anhydride, a phenol or an organic acid. Examples of cyclic acid anhydride include phthalic anhydride, tetrahydrophthalic anhydride, hexahydrophthalic anhydride, 3,6-endoxy-Δ4-tetrahydro-phthalic anhydride, tetrachlorophthalic anhydride, maleic anhydride, chloromaleic anhydride, α-phenylmaleic anhydride, succinic anhydride, and pyromeritic anhydride described in U.S. Pat. No. 4,115,128. Examples of phenol include bisphenol-A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane. Also examples of organic acid include sulfonic acids, sulfinic acids, alkylsulfuric acids, phosphonic acids, phosphoric acid esters and carboxylic acids described for example in JP-A Nos. 60-88942 and 2-96755, and specific examples include p-toluene sulfonic acid, dodecylbenzene sulfonic acid, p-toluene sulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid. The proportion of the cyclic acid anhydrides, phenols and organic acids in the printing plate materials is preferably 0.05 to 20 wt. %, more preferably 0.1 to 15 wt. % and most preferably 0.1 to 10 wt. %.

In the recording layer coating liquid of the invention, for widening the stability of processing to developing conditions, there may be added a nonionic surfactant as described in JP-A Nos. 62-251740 and 3-208514, an amphoteric surfactant as described in JP-A Nos. 59-121044 and 4-13149, a siloxane compound as described in European Patent No. 950517, or a copolymer of a fluorine-containing monomer as described in JP-A No. 11-288093.

Specific examples of the nonionic surfactant include sorbitan tristearate, sorbitan monopalmitate, sorbitan trioleate, stearic acid monoglyceride, and polyoxyethylene nonylphenylether. Specific examples of amphoteric surfactant include alkyldi(aminoethyl)glycin, alkylpolyaminoethylglycin hydrochloric acid salt, 2-alkyl-N-carboxyethyl-N-hydroxyethylimidazolinium betain and N-tetradecyl-N,N-betain (for example "Amogen K" (trade name), manufactured by Dai-ichi Kogyo Co., Ltd.).

As the siloxane compound, there is preferred a block copolymer of dimethylsiloxane and polyalkylene oxide, and specific examples include polyalkylene oxide-denatured silicone such as DBE-224, DBE-621, DBE-712, DBP-732, and DBP-534 manufactured by Chisso Co., Ltd., and Tego Glide 100 manufactured by Tego Inc., Germany.

The proportion of the nonionic surfactant and amphoteric surfactant in the printing plate materials is preferably 0.05 to 15 wt. %, and more preferably 0.1 to 5 wt. %.

In the recording layer of the invention, there may be added a printout agent for obtaining a visible image immediately after heating by exposure, and a dye or a pigment as an image coloring agent.

The printout agent can be represented by a combination of a compound releasing an acid upon heating by exposure (photo-acid releasing agent), and an organic dye capable of forming a salt. Specific examples include a combination of o-naphthoquinone diazide-4-sulfonic acid halogenide and a salt-forming organic dye as described in JP-A Nos. 50-36209 and 53-8128, and a combination of a trihalomethyl compound and a salt-forming organic dye as described in JP-A Nos. 53-36223, 54-74728, 60-3626, 61-143748, 61-151644 and 63-58440. Such trihalomethyl compound can be an oxazole compound or a triazine compound, both being excellent in stability in time and providing a clear printout image.

As a coloring agent for the image, there may be employed another dye in addition to aforementioned salt-forming organic dye. Advantageous examples of the dye including the salt-forming organic dye include oil-soluble dyes and basic dyes. Specific examples include oil yellow #101, oil yellow #103, oil pink #312, oil green BG, oil blue BOS, oil blue #603, oil black BY, oil black BS, oil black T-505 (foregoing manufactured by Orient Kagaku Kogyo Co., Ltd.), Victoria pure blue, crystal violet (CI42555), methyl violet (CI42535), ethyl violet, rhodamine B (CI145170B), marachite green (CI42000), and methylene blue (CI52015). Also particularly preferred are dyes described in JP-A No. 62-293247. These dyes may be added to the printing plate materials in a proportion of 0.01 to 10 wt. %, preferably 0.1 to 3 wt. % with respect to the total solids of the printing plate materials. Also in the printing plate materials employed in the invention, a plasticizer is added if necessary in order to provide a flexibility in the coated film. For example there can be employed butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer or a polymer of acrylic acid or methacrylic acid.

<Recording Layer with Superposed Layer Structure>

The positive working recording layer in the planographic printing plate precursor of the invention may have a superposed layer structure.

The recording layer having the superposed layer structure may be a two-layered recording layer, formed by a resin layer of an alkali-soluble polymer (under layer:adjacent or close to the support member), and a photosensitive layer of which solubility in an alkaline aqueous solution increases upon exposure to light (upper layer: at or close to an exposed surface). Such recording layer has a satisfactory sensitivity to the exposing light (for example an infrared laser), since the upper photosensitive layer has a function similar to aforementioned positive working recording layer, and can achieve a high sensitivity because the resin layer present between the support member and the photosensitive layer functions as a heat insulation layer whereby the heat generated by exposure to light does not diffuse to the support member but can be efficiently utilized. Also in an unexposed portion of the recording layer, the photosensitive layer, having a high dissolution suppressing effect to the alkaline developer, functions as a dissolution suppressing layer whereby the strength of the image portion is not deteriorated to provide an excellent length of run and a stability in time. Also in an exposed portion of the recording layer, since the photosensitive layer, of which solubility in alkaline aqueous solution increases upon exposure to light, is promptly dissolved and dispersed in the developer and also since the resin layer adjacent to the support member is formed by alkali soluble polymer, prompt dissolution can be realized without generating a film residue even with a developer of a lowered activity, thereby realizing excellent developability. Consequently such recording layer can form an image of an excellent discrimination.

Further, the above-mentioned resin layer may include a component other than the alkali soluble polymer. For example, addition of a photothermal converting agent causes heat generation in the exposed portion, whereby the sensitivity of the entire recording layer can be further increased.

<Manufacturing Method for Planographic Printing Plate Precursor of the Invention>

The planographic printing plate precursor of the invention can be produced by coating a support member having aforementioned hydrophilic surface with aforementioned components ordinarily dissolved in a solvent, thereby forming a positive working recording layer.

Examples of the solvent to be used include ethylene dichloride, cyclohexanone, methylethyl ketone, methanol, ethanol, propanol, ethyleneglycolmonomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl-urea, N-methylpyrrolidone, dimethylsulfoxide, sulfolane, γ-butyrolactone, and toluene, but these examples are not restrictive. These solvents may be used singly or in a mixture thereof.

The concentration of aforementioned components (all solids including the additives) in the solvent is preferably 1 to 50 wt. %.

Also the coating amount (solid) on the support member after drying is variable depending on the purpose of use, but, for a photosensitized printing plate, there is generally preferred a range of 0.5 to 5.0 g/$m^2$. With a decrease in the coating amount, the apparent sensitivity increases but film characteristics of the photosensitive film are lowered.

The coating can be achieved by various methods, such as bar coater coating, spin coating, spray coating, curtain coating, immersion coating, air knife coating, blade coating or roller coating.

In the photosensitive layer of the invention, there may be added a surfactant for improving the coating property, for example a fluorinated surfactant as described in JP-A No. 62-170950. The amount of addition with respect to the total solids of the recording layer is preferably 0.01 to 1 wt. %, more preferably 0.05 to 0.5 wt. %.

<Exposure and Development>

The planographic printing plate precursor, prepared as explained in the foregoing, is normally subjected to an image exposure and a development process.

A light source of an active radiation for image exposure can be, for example, a mercury lamp, a metal halide lamp, a xenon lamp, a chemical lamp, or a carbon arc light. The radiation can be, for example, an electron beam, an X-ray, an ion beam, or a far infrared light. There can also be used a g-line light, an i-line light, a deep-UV light, or a high density energy beam (laser beam) A source for the laser beam can be a helium-neon laser, an argon laser, a krypton laser, a helium-cadmium laser or a KrF excimer laser. In the invention, there is preferred a light source having a light emission wavelength in near infrared to infrared region, and a solid-state laser or a semiconductor laser is particularly preferred.

As a developing solution and a replenishing solution for the planographic printing plate of the invention, there can be used an alkaline aqueous solution known conventionally in the art.

For example, there can be employed an inorganic alkali salt such as sodium silicate, potassium silicate, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide or lithium hydroxide. Also there can be used an organic alkali compound such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylenimine, ethylenediamine or pyridine. Such alikali compounds may be used singly or in a combination of two or more kinds.

A particularly preferred developer among these alkali compounds is an aqueous silicate solution such as of sodium silicate or potassium silicate. It is because the developability can be regulated by the ratio and concentration of silicon oxide $SiO_2$ and an alkali metal oxide $M_2O$ constituting the silicate salt, and alkali metal silicate salts as described in JP-A No. 54-62004 and JP-B No. 57-7427 can be effectively used.

Further, in case of development with an automatic developing apparatus, it is already known that many presensitized plates can be developed without replacing the developer in a developing tank over a long period, by adding an aqueous solution (replenishing solution) with an alkali intensity higher than that in the developer to the developer. Such replenishing method can be advantageously employed also in the invention. In the developer solution and the replenishing solution, various surfactants and organic solvents may be added according to the necessity, for the purpose of increasing or suppressing the developability, dispersing development dregs and improving the ink affinity of an image portion of the printing plate.

A preferred surfactant can be an anionic, cationic, nonionic or amphoteric surfactant. Also if necessary, there may be added, to the developer solution and the replenishing solution, a reducing agent such as hydroquinone, resorcin, a sodium salt or a potassium salt of an inorganic acid such as sulfurous acid or hydrogensulfurous acid, an organic carboxylic acid, a defoamer or a water softening agent.

The printing plate developed with aforementioned developer solution and replenishing solution is post-processed with rinsing water, a rinse solution including for example a surfactant, or a desensitizing solution including gum Arabic or a starch derivative. In the post-processing of the planographic printing plate of the invention, these processes may be employed in various combinations.

In the recent platemaking and printing industries, an automatic developing apparatus for a printing plate is widely employed for rationalization and standardization of the platemaking operation. Such automatic development apparatus is generally composed of a development unit and a post-process unit and is provided with an apparatus for conveying a printing plate, tanks for various liquids and a spraying apparatus, in which an exposed printing plate is subjected, while conveyed horizontally, to a development process by spraying various process solutions supplied by pumps from spray nozzles. Recently there is also known a method of processing by conveying a printing plate, for example by in-liquid guide rollers, in a state immersed in a processing solution filled in a processing tank. In such automatic processing, the processing can be executed under replenishment of a replenishing solution to each processing solution according to the processing amount or the working time. Also there may be employed so-called disposable processing method in which the processing is executed with a substantially unused processing solution.

In the planographic printing plate precursor of the invention, in case a planographic printing plate obtained by an image exposure, a development, a rinsing and/or a rinsing and/or a gumming has an unnecessary image portion (for example a trace of an edge of an original film), there is executed an erasure of such unnecessary image portion. For such erasure, there is preferred a method of coating an erasing liquid on the unnecessary image portion and executing a rinsing with water after standing for a predetermined time, as described in JP-B No. 2-13293, but there may also be employed a method of irradiating the unnecessary image portion with an active light guided by an optical fiber and then executing development, as described in JP-A No. 59-174842.

The planographic printing plate thus obtained may be subjected to a printing process after coating, if desired, of a desensitizing gum, but a burning process is executed in case a longer length of run is desired. In case of burning a planographic printing plate, there is preferably executed, prior to the burning, a process with a counter-etching solution as described in JP-B Nos. 61-2518 and 55-28062 and JP-A Nos. 62-31859 and 61-159655.

For such process, there can be employed a method of coating the counter-etching solution on the planographic printing plate with a sponge or a cotton pad, or immersing the printing plate in a vatt filled with the counter-etching solution, or coating with an automatic coater. Also a more preferable result can be provided by making the coating amount uniform with a squeezer or a squeezing roller after the coating.

The coating amount of the counter-etching solution is generally within a range of 0.03 to 0.8 $g/m^2$ (dry weight). The planographic printing plate coated with the counter-etching solution is heated, after drying if necessary, to a high temperature by a burning processor (for example burning processor "BP-1300" supplied by Fuji Photo Film Co., Ltd.). The temperature and time of heating in such operation depend on the kind of components constituting the image, but are preferably in ranges of 180 to 300° C. and 1 to 20 minutes.

The planographic printing plate after the burning process may be suitably subjected to conventional processes such as rinsing and gumming, but so-called desensitizing process such as gumming may be dispensed with in case a counter-etching solution including a water-soluble polymer compound is used. The planographic printing plate obtained by such processes is used for example in an offset printing press and is used for printing a large number of prints.

EXAMPLES

In the following, the present invention will be clarified in more details by examples thereof, but the scope of the invention is not limited by such examples.

Example 1

[Synthesis Example 1 Synthesis of Specified Hydrophilic Polymer]

In a 500 ml three-necked flask, 50 g of acrylamide, 3.4 g of mercaptopropyltrimethoxysilane and 220 g of dimeethylacetamide are charged and added with 0.5 g of 2,2-azobis (2,4-dimethylvaleronitrile) at 65° C. and under a nitrogen flow. After the mixture is maintained at the same temperature for 6 hours under agitation, it is cooled to the room temperature. The mixture is charged into 2 liters of ethyl acetate, and precipitated solid is collected by filtration, and washed with water to obtain hydrophilic polymer. Its weight after drying is 52.4 g. It is confirmed, by GPC (polystyrene standard), as a polymer of a weight-averaged molecular weight of 3000, and, by $^{13}C$-NMR (DMSO-$d_6$), as a specified hydrophilic polymer having a structure of aforementioned specific example (1-1) in which a trimethoxysilyl group (50.0 ppm) is introduced at an end.

[Preparation of Aluminum Substrate]

An aluminum plate (grade 1050) of a thickness of 0.3 mm is degreased by washing with trichloroethylene, then subjected to surface graining with a nylon brush and a suspension of pumice of 400 mesh in water, and washed well with water. This plate is etched by immersing in a 25 wt. % aqueous solution of sodium hydroxide of 45° C. for 9 seconds, then washed with water, further immersed in 2 wt. % nitric acid for 20 seconds and washed with water. In this operation, the etching amount of the grained surface is about 3 g/$m^2$.

Then the plate is subjected to the formation of a DC anodized film so as to obtain a thickness of 2.4 g/$m^2$ at a current density of 15 A/$dm^2$ utilizing 7 wt. % sulfuric acid as an electrolyte solution, and then washed with water and dried to obtain an aluminum substrate as the substrate for the support member.

[Formation of Hydrophilic Surface]

Following composition is mixed uniformly and agitated for 2 hours at 20° C. for hydrolysis to obtain a sol hydrophilic coating liquid composition.

| (Hydrophilic coating liquid composition) | |
|---|---|
| specified hydrophilic polymer [example compound (1—1)] | 0.21 g |
| tetramethoxysilane | 0.62 g |
| ethanol | 4.70 g |
| water | 4.70 g |
| aqueous nitric acid solution (1 N) | 0.10 g |

Then the hydrophilic coating liquid composition is coated on the aluminum substrate so as to obtain a coating amount of 2 g/$m^2$ after drying, and is dried for 10 minutes by drying at 100° C. to form a hydrophilic layer (hydrophilic surface) composed of an organic-inorganic complex, thereby forming a support member.

A contact angle (water drop in air) of the hydrophilic surface on the obtained support member, measured with CA-Z (manufactured by Kyowa Kaimen Kagaku Co., Ltd.), is 7.9°, confirming excellent surface hydrophilicity.

[Preparation of Positive Working Recording Layer]

Following coating liquid for positive working recording layer is coated on the obtained support member with a coating amount of 1.0 g/$m^2$, and dried in PERFECT OVEN PH200, manufactured by TABAI Corp. for 50 seconds at 140° C. with Wind Control set at 7, thereby forming a positive working recording layer and thus completing a planographic printing plate precursor of example 1.

| (Coating liquid for positive working recording layer) | |
|---|---|
| N-(4-aminosulfonylphenyl)methacrylamide/acrylonitrile/methyl methacrylate (35/35/30: weight-averaged molecular weight 50,000) | 1.896 g |
| novolac resin (Sumitomo-Durez Co., Ltd.; Sumilight Resin PPR54020) | 0.332 g |
| cyanine dye A (following structure) | 0.155 g |
| 4,4'-bishydroxyphenylsulfone | 0.063 g |
| tetrahydrophthalic anhydride | 0.190 g |
| p-toluenesulfonic acid | 0.008 g |
| ethyl violet of which counter ion is changed to 6-hydroxynaphthalene sulfonic acid | 0.05 g |
| fluorinated surfactant (Megafac F176; Dai-Nippon Ink and Chemical Industries, Co. Ltd.) | 0.145 g |
| fluorinated surfactant (Megafac MCF-312 (30%); Dai-Nippon Ink and Chemical Industries, Co. Ltd.) | 0.120 g |
| methylethylketone | 26.6 g |
| 1-methoxy-2-propanol | 13.6 g |
| γ-butyrolactone | 13.8 g |

Cyanine Dye A

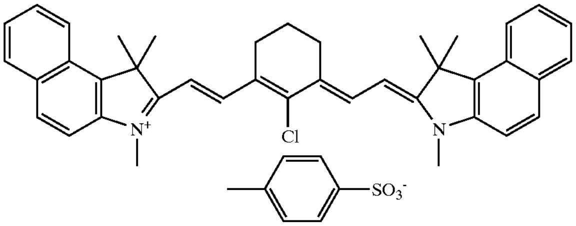

[Evaluation of Planographic Printing Plate Precursor]

The obtained planographic printing plate precursor is subjected to exposure, development and printing and scumming on the obtained prints is evaluated.

The planographic printing plate precursor is subjected to the writing of a test pattern on Creo Trendsetter with a beam intensity of 9 W and a drum revolution of 150 rpm. Thereafter it is developed with PS processor 900H (manufactured by Fuji Photo Film Co., Ltd.) charged with a developer DT-1 (diluted to 1:8) manufactured by Fuji Photo Film Co., Ltd. and a finisher FP2W (diluted to 1:1) manufactured by Fuji Photo Film Co., Ltd. with a liquid temperature of 30° C. and a developing time of 12 seconds. The electric conductivity of the developer at this operation is 45 mS/cm.

The developed planographic printing plate is mounted on a printing press (Ryobi 3200 (trade name), manufactured by Ryobi Imagics Co., Ltd.) and subjected to a printing operation, utilizing fountain solutions IF201 (2.5%) and IF202(0.75%) (manufactured by Fuji Photo Film Co., Ltd.) and an ink GEOS-G Black (manufactured by Dai-Nippon Ink and Chemical Industries Co., Ltd.).

As a result, the printing with the planographic printing plate of the example 1 of the invention provides a print of a high image quality with a low scumming level. When the printing operation is continued in continuous manner, the planographic printing plate of the example 1 provides a satisfactory print without scumming in the non-image portion even after printing of 9,000 copies, thereby confirming that the excellent hydrophilicity can be maintained.

Examples 2 to 15

Support members having a hydrophilic surface are prepared in the same manner as in the example 1, except that the composition of the hydrophilic coating liquid and the coating amount thereof are changed as shown in Table 1. A positive working recording layer is prepared in the same manner as in the example 1, on each of such support members, to obtain planographic printing plate precursors of examples 2 to 15.

[Evaluation of Planographic Printing Plate Precursor]

The planographic printing plate precursors obtained in the examples 2 to 15 are respectively subjected to exposure, development and printing in the same manner as in the example 1, and scumming on the obtained prints is evaluated. Results are shown in Table 1.

TABLE 1

| | Hydrdophilic coating liquid composition | | | | | |
|---|---|---|---|---|---|---|
| | Specified hydrophilic polymer | Specified hydrophilic polymer/ tetramethoxy-silane weight ratio | Coating amount ($g/m^2$) | Surface hydrophilicity Contact angle (°) | Printing scumming 9000 prints | 15000 prints |
| Example 2 | (1-1) | 25/75 | 1 | 8.0 | + | + |
| Example 3 | (1-1) | 25/75 | 0.5 | 7.5 | + | + |
| Example 4 | (1-1) | 25/75 | 0.1 | 7.4 | + | + |
| Example 5 | (1-1) | 25/75 | 0.05 | 7.4 | + | + |
| Example 6 | (1-1) | 10/90 | 0.5 | 12.0 | + | ± |
| Example 7 | (1-1) | 50/50 | 0.5 | 7.3 | + | + |
| Example 8 | (1-1) | 100/0 | 0.1 | 6.5 | + | + |
| Example 9 | (1-3) | 25/75 | 2 | 8.1 | + | + |
| Example 10 | (1-15) | 25/75 | 2 | 8.1 | + | + |
| Example 11 | (1-17) | 25/75 | 1 | 7.5 | + | + |
| Example 12 | (1-22) | 25/75 | 0.1 | 6.9 | + | + |
| Example 13 | (1-23) | 50/50 | 0.5 | 8.5 | + | + |
| Example 14 | (2-1) | 25/75 | 0.5 | 13.0 | + | + |
| Example 15 | (2-2) | 10/90 | 0.5 | 12.0 | + | ± |

As will be apparent from Table 1, the printing with the planographic printing plates of the examples 2 to 15 of the invention also provides prints of a high image quality with a low scumming level. When the printing operation is continued in continuous manner, the planographic printing plates of the examples 2 to 15 provide satisfactory prints without scumming in the non-image portion even after printing of 9,000 or 15,000 copies, thereby confirming that the excellent hydrophilicity can be maintained.

Example 16

A planographic printing plate precursor of example 16 is prepared in a similar manner as in the example 1, except that the positive working recording layer is formed as a recording layer of a superposed layer structure in the following manner.

A support member having a hydrophilic layer (hydrophilic surface) employed in the example 1 is coated with a following under layer coating liquid so as to obtain a coating amount of 0.85 $g/m^2$, then dried in PERFECT OVEN PH200, manufactured by TABAI Corp. for 50 seconds at 140° C. with Wind Control set at 7, then coated with a following upper layer coating liquid so as to obtain a coating amount of 0.15 $g/m^2$ and dried in a similar manner for 1 minute at 120° C. thereby forming a positive working recording layer of a superposed layer structure and thus completing a planographic printing plate precursor of example 16.

| (Under layer coating liquid) | |
|---|---|
| N-(4-aminosulfonylphenyl)methacrylamide/acrylonitrile/methyl methacrylate (36/34/30: weight-averaged molecular weight 50,000) | 1.896 g |

-continued

| | |
|---|---|
| m,p-cresol novolac (m/p = 6/4, weight averaged molecular weight 4500, residual monomer 0.8 wt. %) | 0.237 g |
| cyanine dye A (aforementioned structure) | 0.109 g |
| 4,4'-bishydroxyphenylsulfone | 0.063 g |
| tetrahydrophthalic anhydride | 0.190 g |
| p-toluenesulfonic acid | 0.008 g |
| ethyl violet of which counter ion is changed to 6-hydroxynaphthalene sulfonic acid | 0.05 g |
| fluorinated surfactant (Megafac F176; Dai-Nippon Ink and Chemical Industries, Co. Ltd.) | 0.035 g |
| methylethylketone | 26.6 g |
| 1-methoxy-2-propanol | 13.6 g |
| γ-butyrolactone | 13.8 g |
| (Upper layer coating liquid) | |
| m,p-cresol novolac (m/p = 6/4, weight averaged molecular weight 4500, residual monomer 0.8 wt. %) | 0.237 g |
| cyanine dye A (aforementioned structure) | 0.047 g |
| dodecyl stearate | 0.060 g |
| 3-methoxy-4-diazodiphenylamine hexafluorophosphate | 0.030 g |
| fluorinated surfactant (Megafac F176; Dai-Nippon Ink and Chemical Industries, Co. Ltd.) | 0.110 g |
| fluorinated surfactant (Megafac MCF-312 (30%); Dai-Nippon Ink and Chemical Industries, Co. Ltd.) | 0.120 g |
| methylethylketone | 15.1 g |
| 1-methoxy-2-propanol | 7.7 g |
| [Evaluation of planographic printing plate precursor] | |

The planographic printing plate precursor obtained in the example 16 is subjected to exposure, development and printing in the same manner as in the example 1, and scumming on the obtained prints is evaluated. As a result, the printing with the planographic printing plate of the example 16 of the invention also provides prints of a high image quality with a low scumming level. When the printing operation is continued in continuous manner, the planographic printing plate of the example 16 provides satisfactory prints without scumming in the non-image portion even after printing of 9,000 copies, thereby confirming that the excellent hydrophilicity can be maintained.

Examples 17 to 20

Support members having a hydrophilic surface are prepared in the same manner as in the example 1, except that the composition of the hydrophilic coating liquid and the coating amount thereof are changed as shown in Table 1. A positive working recording layer is prepared in the same manner as in the example 1, on each of such support members, to obtain planographic printing plate precursors of examples 17 to 20.

[Evaluation of Planographic Printing Plate Precursor]

The planographic printing plate precursors obtained in the examples 17 to 20 are respectively subjected to exposure, development and printing in the same manner as in the example 1, and scumming on the obtained prints is evaluated. Results are shown in Table 2.

TABLE 2

| | Hydrdophilic coating liquid composition | | | | | |
|---|---|---|---|---|---|---|
| | Specified hydrophilic polymer | Specified hydrophilic polymer/ tetramethoxy-silane weight ratio | Coating amount ($g/m^2$) | Surface hydro-philicity Contact angle (°) | Printing scumming 9000 prints | 15000 prints |
| Example 17 | (1-1) | 25/75 | 0.5 | 7.5 | + | + |
| Example 18 | (1-1) | 25/75 | 0.1 | 7.4 | + | + |
| Example 19 | (1-1) | 10/90 | 0.5 | 12.0 | + | ± |
| Example 20 | (1-9) | 50/50 | 0.1 | 6.9 | + | + |

As will be apparent from Table 2, the printing with the planographic printing plates of the examples 17 to 20 of the invention also provides prints of a high image quality with a low scumming level. When the printing operation is continued in continuous manner, the planographic printing plates of the examples 17 to 20 provide satisfactory prints without scumming in the non-image portion even after printing of 9,000 or 15,000 copies, thereby confirming that the excellent hydrophilicity can be maintained.

The planographic printing plate precursor of the invention, utilizing a support member having a hydrophilic surface excellent in hydrophilicity and durability thereof, provides effects of improving the scumming in the printing operation and providing a large number of prints of a high image quality even under severe printing conditions.

What is claimed is:

1. A planographic printing plate precursor comprising:

a support comprising a substrate and a hydrophilic layer disposed on a surface of the substrate, the hydrophilic layer including hydrophilic polymer and a crosslinked structure formed by hydrolysis or condensation polymerization of an alkoxide compound including an element selected from the group consisting of Si, Ti, Zr and Al; and a positive working recording layer disposed on the support and including a material for absorbing light and generating heat, and a polymer compound, which is insoluble in water and soluble in alkali;

wherein a solubility of the positive working recording layer in an alkaline aqueous solution is increased by exposure to light, and the hydrophilic polymer is represented by a following general formula (1):

General Formula (1)

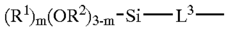
(iii)

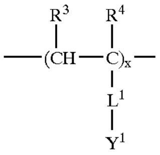
(i)

-continued

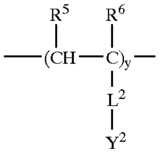
(ii)

wherein the general formula (1) represents a polymer compound including a silane coupling group represented by a structural unit (iii) at an end of polymer units represented by structural units (i) and (ii), wherein each of $R^1$, $R^2$, $R^3$, $R^4$, $R^5$ and $R^6$ independently represents a hydrogen atom or a hydrocarbon group of 1 to 8 carbon atoms; m represents 0, 1 or 2; x and y each represents a composition ratio in which x+y=100 and x:y is in a range from 100:0 to 1:99; each of $L^1$, $L^2$ and $L^3$ independently represents a single bond or an organic connecting group; each of $Y^1$ and $Y^2$ independently represents —$N(R^7)(R^8)$, —OH, —$NHCOR^7$, —$COR^7$, —$CO_2M$ or —$SO_3M$ in which $R^7$ and $R^8$ independently represent a hydrogen atom or an alkyl group of 1 to 8 carbon atoms and M represents a hydrogen atom, an alkali metal, an alkali earth metal or an onium.

2. The planographic printing plate precursor of claim 1, wherein each of $R^1$ to $R^6$ in the general formula (1) is independently selected from the group consisting of a hydrogen atom, a methyl group and an ethyl group.

3. The planographic printing plate precursor of claim 1, wherein each of $Y^1$ and $Y^2$ in the general formula (1) is independently selected from the group consisting of —$NHCOCH_3$, —$CONH_2$, —COOH, —$SO_3$-$Nme^{4+}$ and a morpholino group.

4. The planographic printing plate precursor of claim 1, wherein the hydrophilic polymer has a molecular weight of from 1,000 to 100,000.

5. The planographic printing plate precursor of claim 1, wherein the hydrophilic polymer is a copolymer with another monomer selected from the group consisting of acrylic acid esters, methacrylic acid esters, acrylamides, methacrylamide, vinyl esters, styrenes, acrylic acid, methacrylic acid, acrylonitrile, maleic anhydride and maleimide.

6. The planographic printing plate precursor of claim 1, wherein the hydrophilic surface is formed by coating and drying, on a surface of the aluminum substrate, a hydrophilic coating liquid including a hydrophilic polymer and a crosslinkiing component represented by a following general formula (3):

$$(R^9)_m\text{—X—}(OR^{10})_{4-m} \qquad \text{General Formula (3)}$$

wherein each of $R^9$ and $R^{10}$ independently represents an alkyl group; X represents Si, Al, Ti or Zr; and m represents an integer from 0 to 2.

7. The planographic printing plate precursor of claim 1, wherein the substance capable of generating heat by light absorption is an infrared absorbing dye or an infrared absorbing pigment having an absorption maximum in a wavelength region of from 760 to 1200 nm.

8. The planographic printing plate precursor of claim 1, wherein the substance capable of generating heat by light absorption is a dye selected from the group consisting of azo dyes, metal complex azo dyes, pyrazolone azo dyes, naphthoquinone dyes, anthraquinone dyes, phthalocyanine dyes, carbonium dyes, quinonimine dyes, methine dyes, cyanine dyes, squarilium dyes, pyrilium salts, metal thiolate complexes, oxonol dyes, diimmonium dyes, aminium dyes and chroconium dyes.

9. The planographic printing plate precursor of claim 1, wherein the substance capable of generating heat by light absorption is a pigment selected from the group consisting of insoluble azo pigments, azo lake pigments, condensed azo pigments, chelate azo pigments, phthalocyanine pigments, anthraquinone pigments, perylene pigments, perynone pigments, thioindigo pigments, quinachrydone pigments, dioxazine pigments, isoindolinone pigments, quinophthalone pigments, vat lake pigments, azine pigments, nitroso pigments, nitro pigments, natural pigments, fluorescent pigments, inorganic pigments and carbon black.

10. The planographic printing plate precursor of claim 1, wherein the polymer compound, which is insoluble in water and soluble in alkali, comprises, in the polymer molecule, an acidic group selected from the group consisting of:

(1) phenolic hydroxyl groups, (2) sulfonamide groups, (3) substituted sulfonamide acidic groups (active imide groups), (4) carboxylic acid groups, (5) sulfonic acid groups, and (6) phosphoric acid groups.

11. The planographic printing plate precursor of claim 1, wherein the polymer compound, which is insoluble in water and soluble in alkali, is a resin selected from the group consisting of phenol formaldehyde resins, m-cresol formaldehyde resins, p-cresol formaldehyde resins, rn-/p-mixed cresol formaldehyde resins, phenol/cresol mixed formaldehyde resins, t-butylphenol formaldehyde resins, octylphenol formaldehyde resins, and pyrogallol acetone resins.

12. The planographic printing plate precursor of claim 11, wherein the resin has a weight-average molecular weight of from 500 to 20,000 and a number-average molecular weight of from 200 to 10,000.

13. The planographic printing plate precursor of claim 1, wherein the material for absorbing light and generating heat is a cyanine dye.

14. The planographic printing plate precursor of claim 1, wherein the exposure is conducted by using a semiconductor laser having a light emission wavelength in an infrared region.

15. A planographic printing plate precursor comprising:

a support comprising a substrate and a hydrophilic layer disposed on a surface of the substrate, the hydrophilic layer including hydrophilic polymer and a crosslinked structure formed by hydrolysis or condensation polymerization of an alkoxide compound including an element selected from the group consisting of Si, Ti, Zr and Al; and a positive working recording layer disposed on the support and including a material for absorbing light and generating heat, and a polymer compound, which is insoluble in water and soluble in alkali;

wherein a solubility of the positive working recording layer in an alkaline aqueous solution is increased by exposure to light, and the hydrophilic polymer is represented by a following general formula (2):

General formula (2)

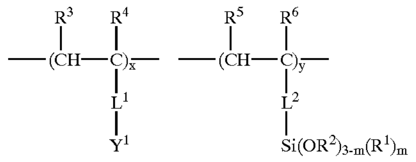

wherein each of $R^1$, $R^2$, $R^3$, $R^4$, $R^5$ and $R^6$ independently represents a hydrogen atom or a hydrocarbon group of 1 to 8 carbon atoms; m represents 0, 1 or 2; x and y each represents a composition ratio in which x+y=100 and x:y is in a range from 99:1 to 50:50; each of $L^1$ and $L^2$ represents a single bond or an organic connecting group; $Y^1$ represents —$N(R^7)(R^8)$, —OH, —$NHCOR^7$, —$COR^7$, —$CO_2M$ or —$SO_3M$ in which each of $R^7$ and $R^8$ independently represents a hydrogen atom or an alkyl group of 1 to 8 carbon atoms and M represents a hydrogen atom, an alkali metal, an alkali earth metal or an onium.

16. The planographic printing plate precursor of claim 15, wherein each of $R^1$ to $R^6$ in the general formula (2) is independently selected from the group consisting of a hydrogen atom, a methyl group and an ethyl group.

17. The planographic printing plate precursor according to claim 15, wherein $Y^1$ in the general formula (2) is selected from the group consisting of —$NHCOCH_3$, —$CONH_2$, —COOH, —$SO_3$-$Nme^{4+}$ and a morpholino group.

18. The planographic printing plate precursor according to claim 15, wherein the hydrophilic polymer has a molecular weight of from 1,000 to 100,000.

19. The planographic printing plate precursor of claim 15, wherein the hydrophilic polymer is a copolymer with another monomer selected from the group consisting of acrylic acid esters, methacrylic acid esters, acrylamides, methacrylamide, vinyl esters, styrenes, acrylic acid, rnethacrylic acid, acrylonitrile, maleic anhydride and maleimide.

20. A planographic printing plate precursor comprising:

a support comprising a substrate and a hydrophilic layer disposed on a surface of the substrate, the hydrophilic layer including hydrophilic polymer and a crosslinked structure formed by hydrolysis or condensation polymerization of an alkoxide compound including an element selected from the group consisting of Si, Ti, Zr and Al; and a positive working recording layer disposed on the support and including a material for absorbing liaht and generating heat, and a polymer compound, which is insoluble in water and soluble in alkali;

wherein a solubility of the positive working recording layer in an alkaline aqueous solution is increased by exposure to light, wherein the hydrophilic surface is formed by coating and drying, on a surface of the aluminum substrate, a hydrophilic coating liquid including a hydrophilic polymer and a crosslinking component represented by a following general formula (3):

$(R^9)_m$—X—$(OR^{10})_{4-m}$ General Formula (3)

wherein each of $R^9$ and $R^{10}$ independently represents an alkyl group: X represents Si, Al, Ti or Zr; and m represents an integer from 0 to 2, and wherein the hydrophilic polymer is a hydrophilic polymer represented by the general formula (2):

General formula (2)

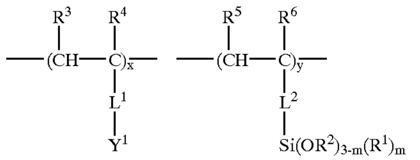

wherein each of $R^1$, $R^2$, $R^3$, $R^4$, $R^5$ and $R^6$ independently represents a hydrogen atom or a hydrocarbon group of 1 to 8 carbon atoms; m represents 0, 1 or 2; x and y each represents a composition ratio in which x+y=100 and x:y is in a range from 99:1 to 50:50; each of $L^1$ and $L^2$ independently represents a single bond or an organic connecting group; $Y^1$ represents —$N(R^7)(R^8)$, —OH, —$NHCOR^7$, —$COR^7$, —$CO_2M$ or —$SO_3M$ in which each of $R^7$ and $R^8$ independently represents a hydrogen atom or an alkyl group of 1 to 8 carbon atoms and M represents a hydrogen atom, an alkali metal, an alkali earth metal or an onium.

21. A planographic printing plate precursor comprising:

a support comprising a substrate and a hydrophilic layer disposed on a surface of the substrate, the hydrophilic layer including hydrophilic graft chains and a crosslinked structure formed by hydrolysis or condensation polymerization of an alkoxide compound including an element selected from the group consisting of Si, Ti, Zr and Al; and a positive working recording layer disposed on the support and including a material for absorbing light and generating heat, and a polymer compound, which is insoluble in water and soluble in alkali;

wherein a solubility of the positive working recording layer in an alkaline aqueous solution is increased by exposure to light, and the recording layer has a superposed layer structure comprising an under layer and an upper layer.

22. The planographic printing plate precursor of claim 21, wherein both the under layer and the upper layer comprise a material for absorbing light and generating heat.

* * * * *